United States Patent
Sohn

(10) Patent No.: US 11,985,896 B2
(45) Date of Patent: May 14, 2024

(54) POWER GENERATION DEVICE

(71) Applicant: LG INNOTEK CO., LTD., Seoul (KR)

(72) Inventor: Hyung Min Sohn, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/793,270

(22) PCT Filed: Jan. 13, 2021

(86) PCT No.: PCT/KR2021/000480
§ 371 (c)(1),
(2) Date: Jul. 15, 2022

(87) PCT Pub. No.: WO2021/145677
PCT Pub. Date: Jul. 22, 2021

(65) Prior Publication Data
US 2023/0040557 A1    Feb. 9, 2023

(30) Foreign Application Priority Data

Jan. 16, 2020   (KR) .................. 10-2020-0006194
Jan. 16, 2020   (KR) .................. 10-2020-0006195

(51) Int. Cl.
*H10N 10/17*   (2023.01)
(52) U.S. Cl.
CPC .................. *H10N 10/17* (2023.02)
(58) Field of Classification Search
CPC ....................................... H10N 10/17
See application file for complete search history.

(56) References Cited

U.S. PATENT DOCUMENTS

| 3,530,009 A | * | 9/1970 | Dick ............... B64G 1/222 |
| | | | 136/202 |
| 2009/0071526 A1 | * | 3/2009 | Parker ............. H10N 10/13 |
| | | | 136/205 |
| 2013/0061900 A1 | | 3/2013 | Tachibana |
| 2014/0230872 A1 | | 8/2014 | Makino et al. |
| 2019/0109272 A1 | | 4/2019 | Kozlowski et al. |

FOREIGN PATENT DOCUMENTS

| JP | 2013-77810 A | 4/2013 |
| JP | 2017-147267 A | 8/2017 |
| KR | 10-0620913 B1 | 9/2006 |
| KR | 10-2018-0134340 A | 12/2018 |
| KR | 10-2019-0065763 A | 6/2019 |
| KR | 10-2019-0117134 A | 10/2019 |

* cited by examiner

*Primary Examiner* — Lindsey A Buck
(74) *Attorney, Agent, or Firm* — Birch, Stewart, Kolasch & Birch, LLP

(57) ABSTRACT

A power generation device according to an embodiment of the present invention comprises: a cooling part; a thermoelectric module disposed on a first region of one surface of the cooling part; a connector part disposed on a second region of the one surface of the cooling part and connected to the thermoelectric module; a heat insulating member disposed on the connector part and disposed so as to expose a side surface of the connector part; a shield member disposed so as to cover the heat insulating member and the connector part; and a first insulating layer disposed between the connector part and the shield member.

9 Claims, 16 Drawing Sheets

[FIG. 1]
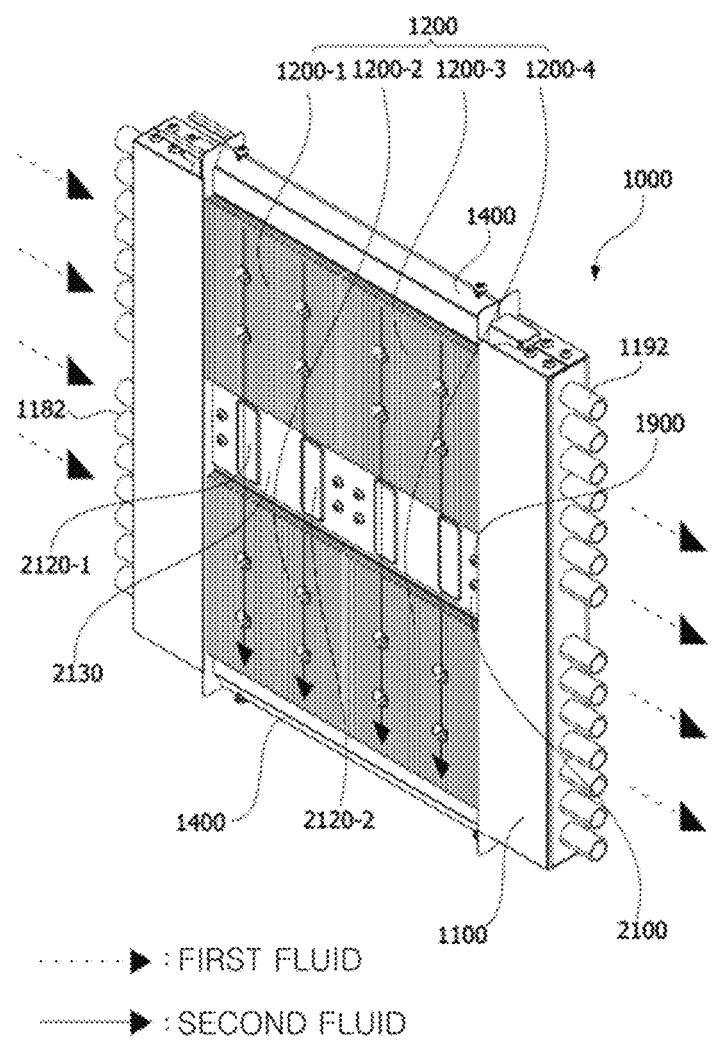

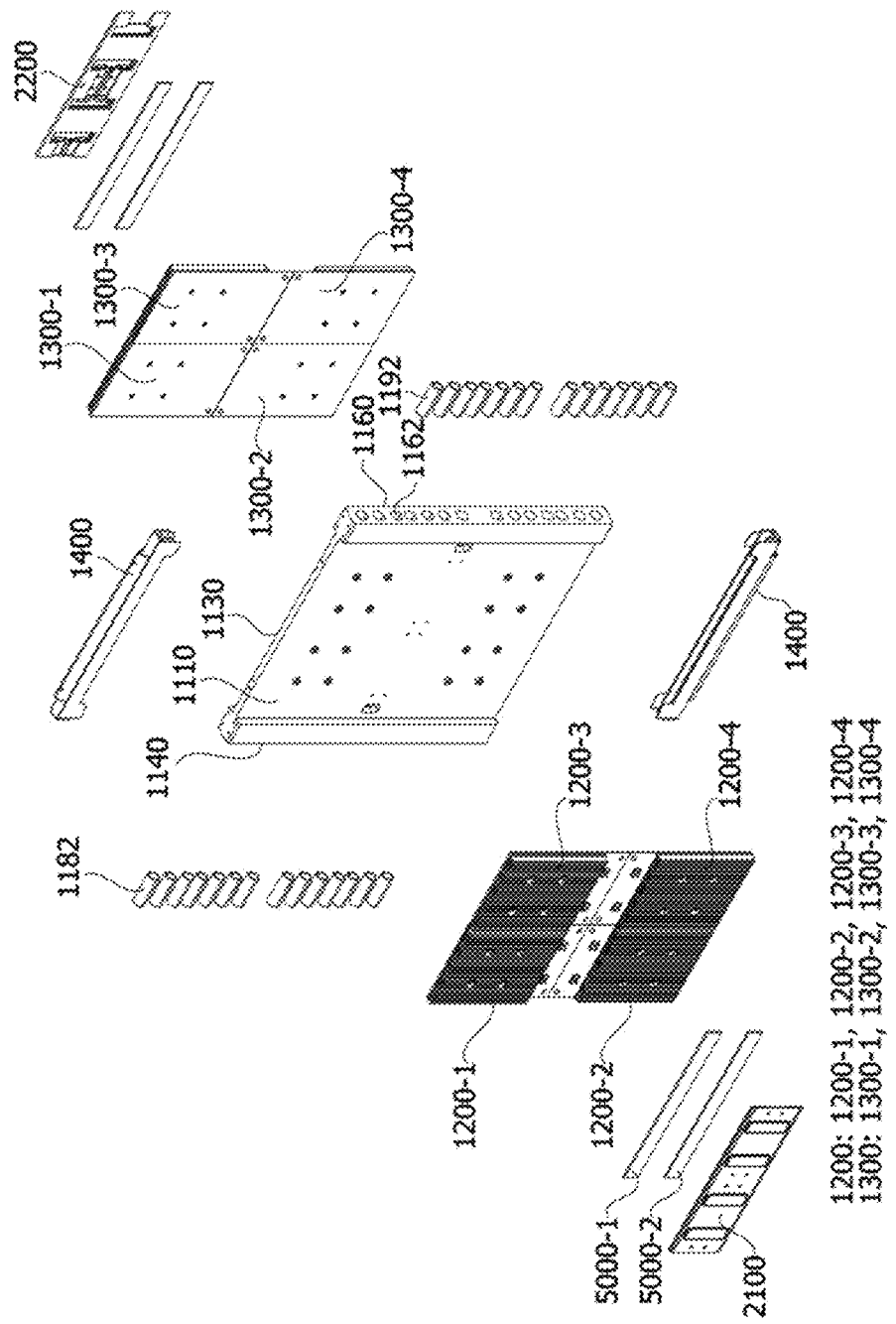
[FIG. 2]

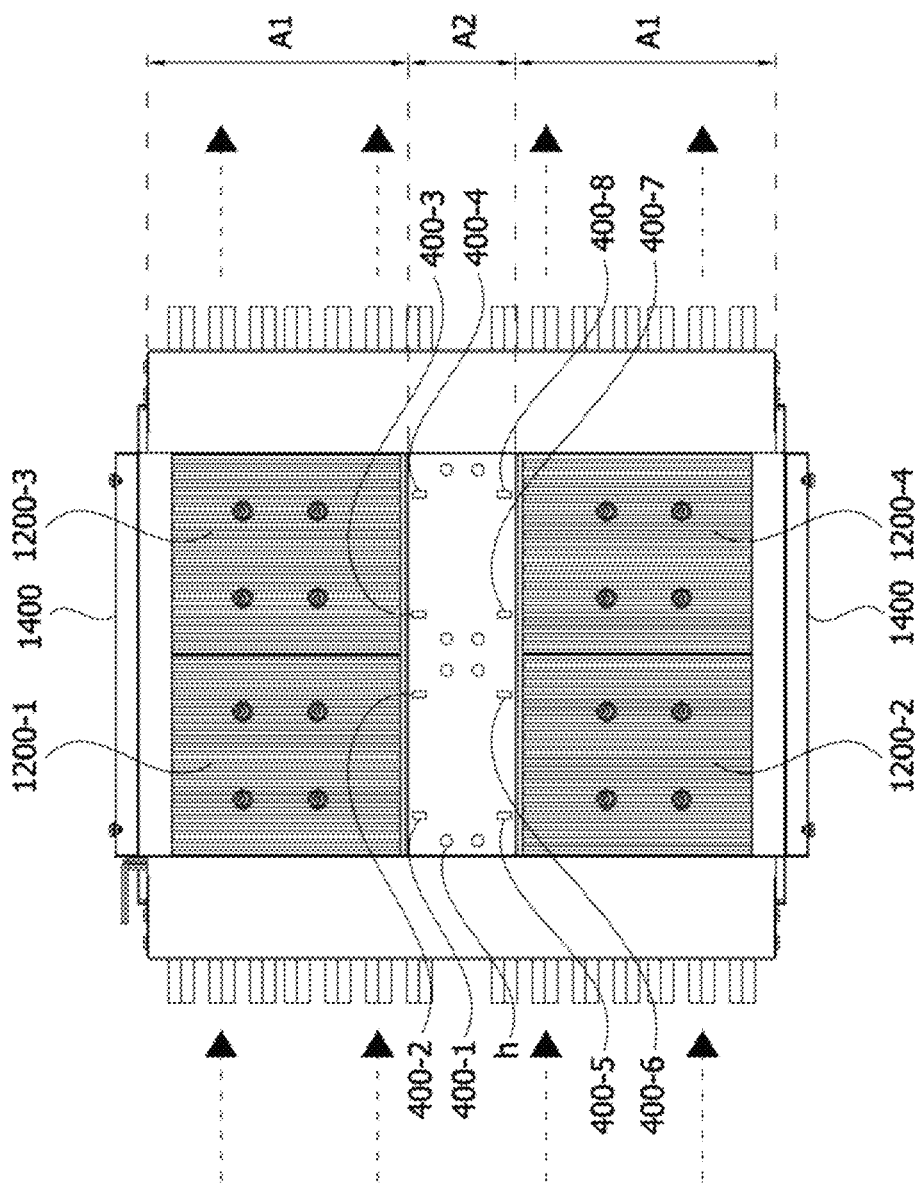
[FIG. 3]

[FIG. 4]
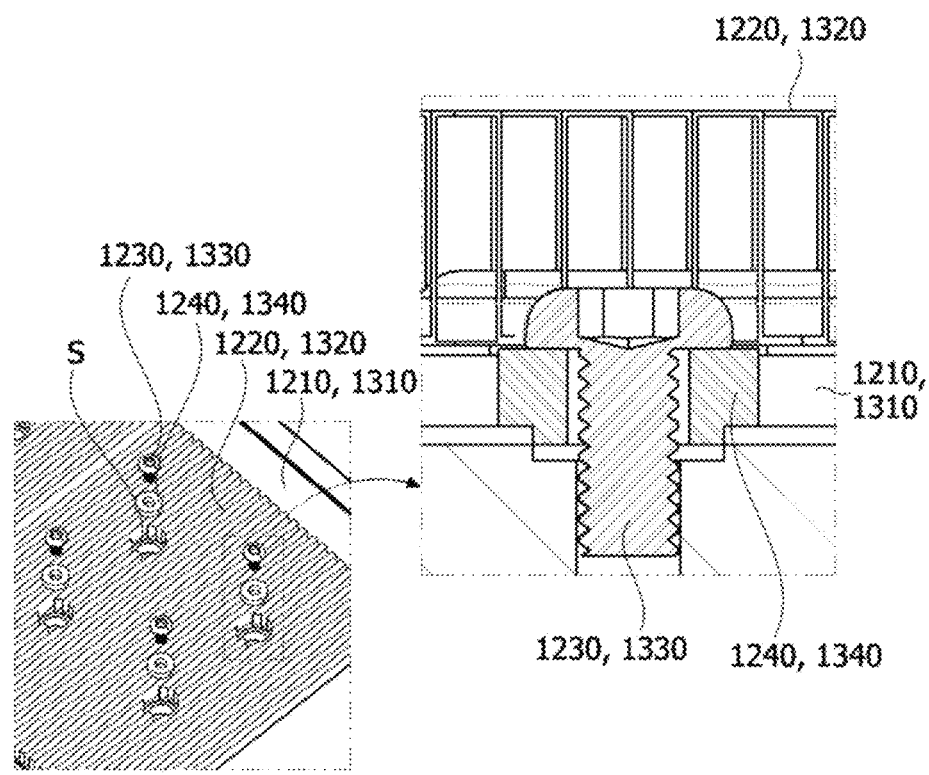

[FIG. 5]
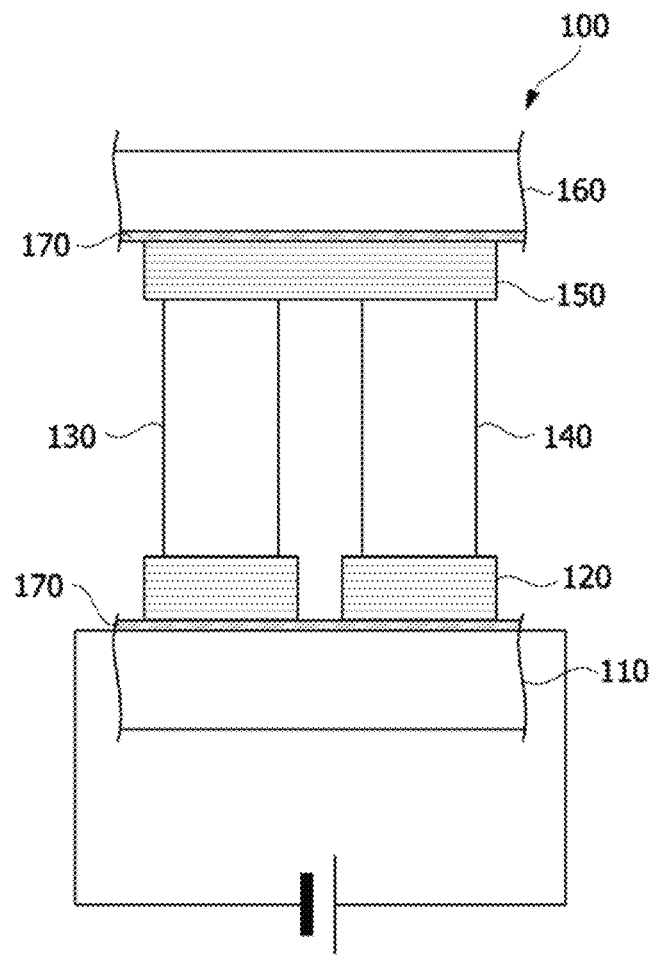

[FIG. 6]
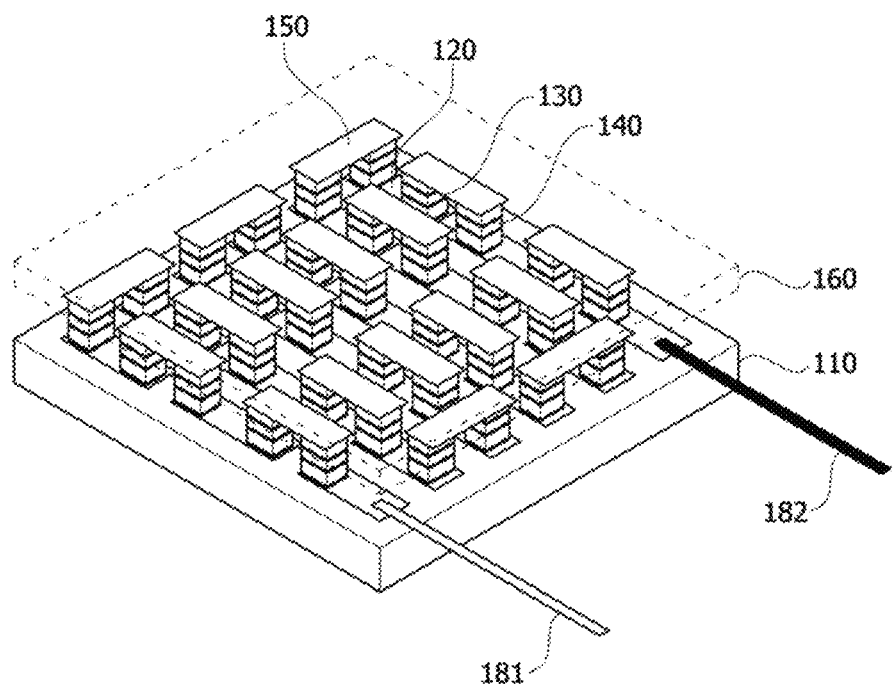

[FIG. 7]
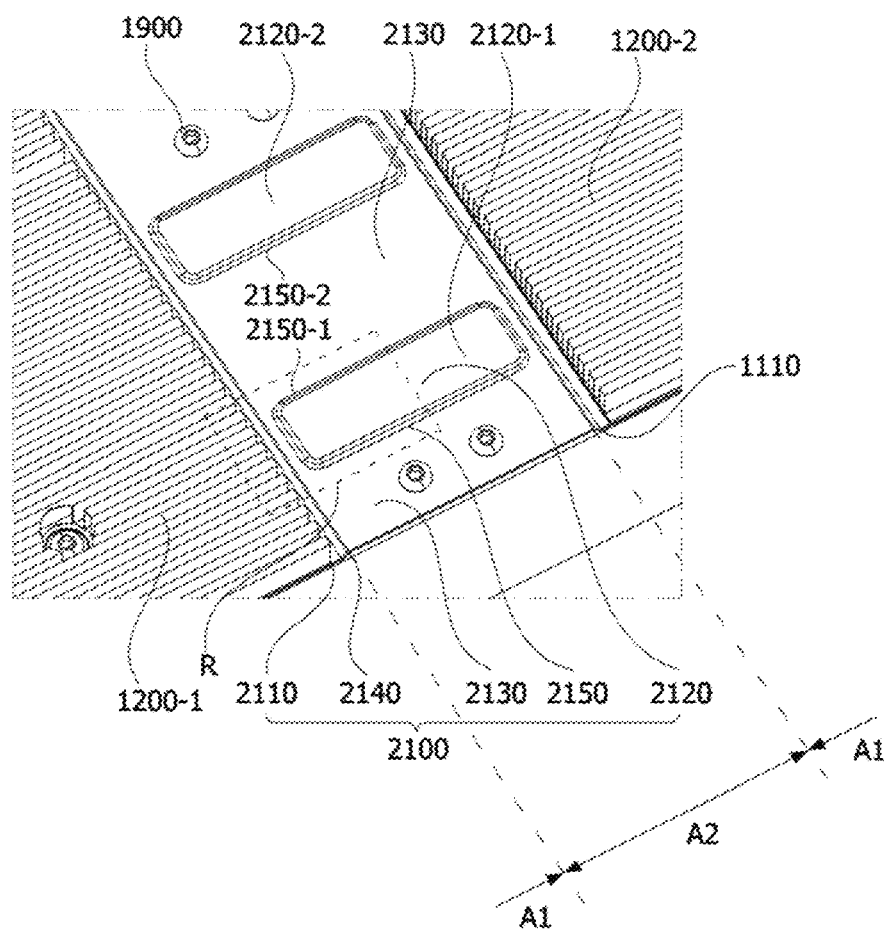

[FIG. 8]
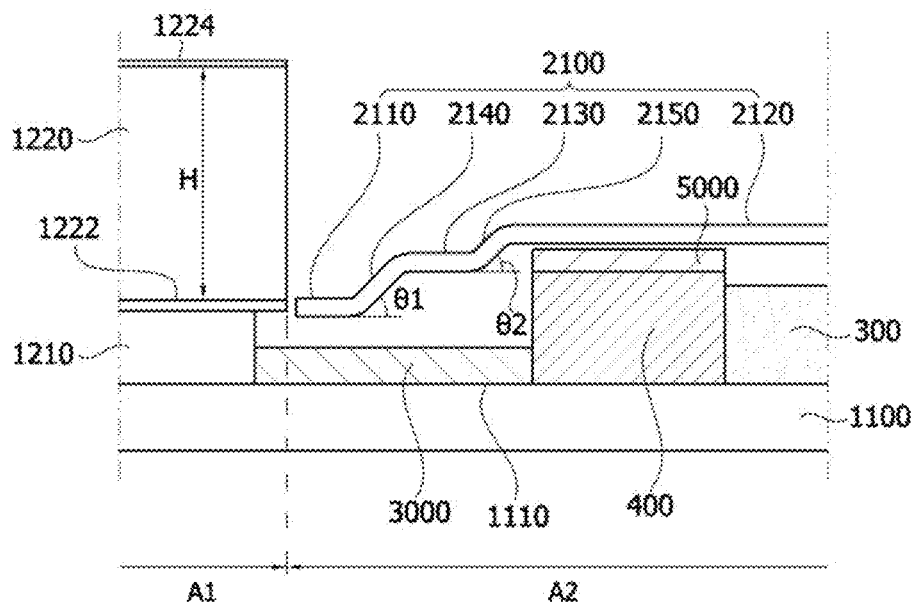
[FIG. 9]
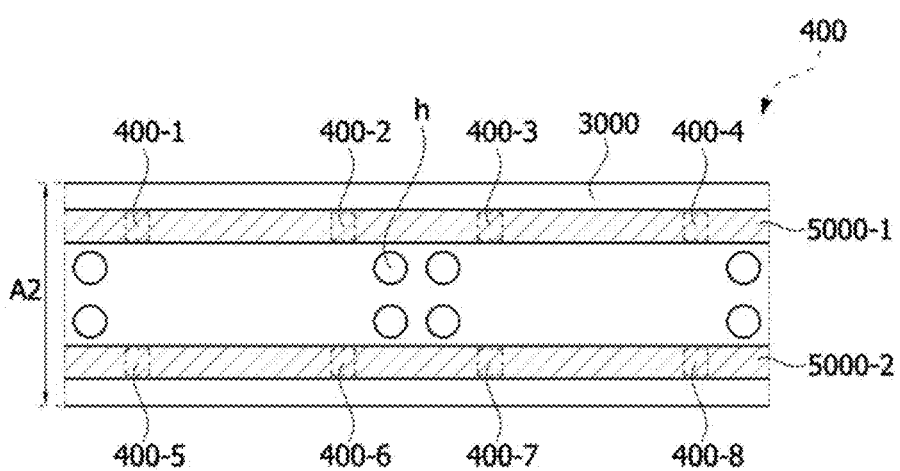
5000: 5000-1, 5000-2
400: 400-1, 400-2, 400-3, 400-4, 400-5, 400-6, 400-7, 400-8

[FIG. 10]
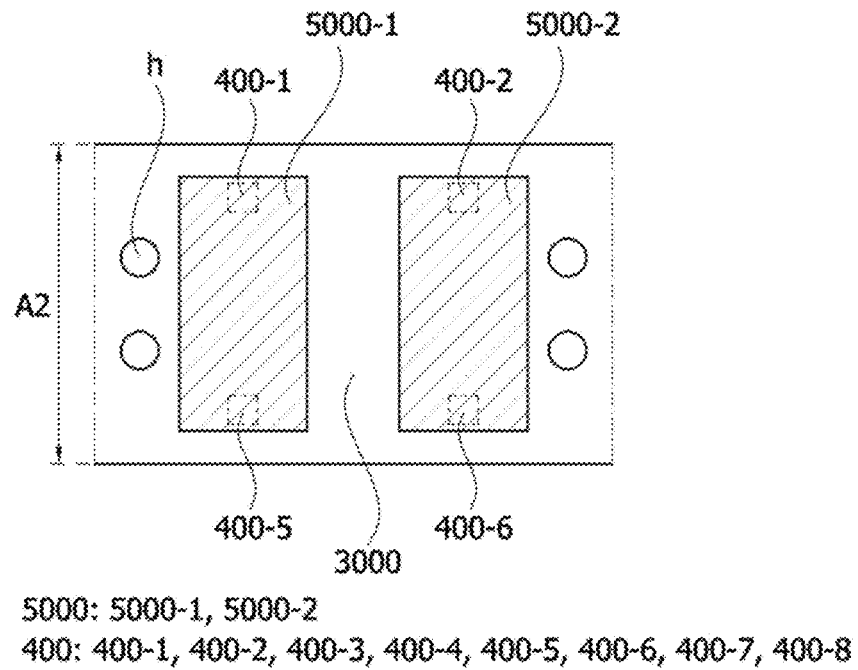
5000: 5000-1, 5000-2
400: 400-1, 400-2, 400-3, 400-4, 400-5, 400-6, 400-7, 400-8
[FIG. 11]
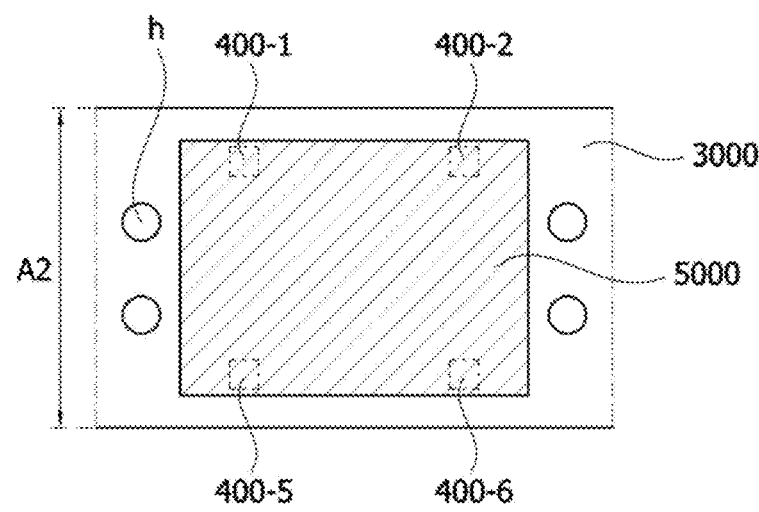
5000: 5000-1, 5000-2
400: 400-1, 400-2, 400-3, 400-4, 400-5, 400-6, 400-7, 400-8

[FIG. 12]
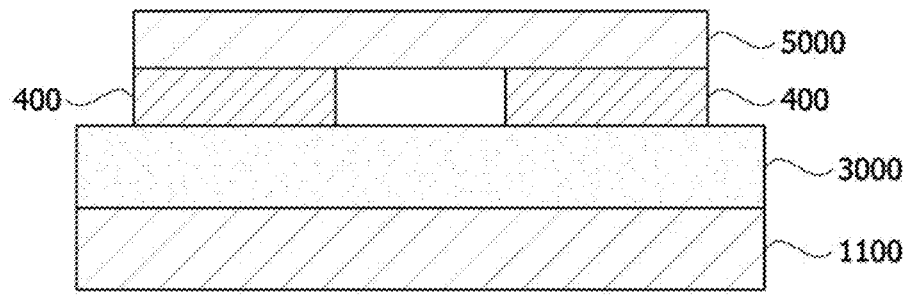
[FIG. 13]
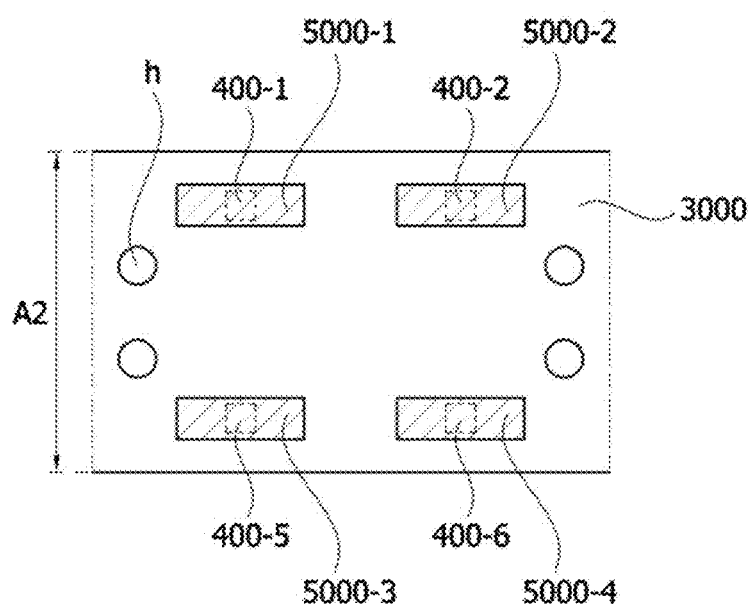
[FIG. 14]
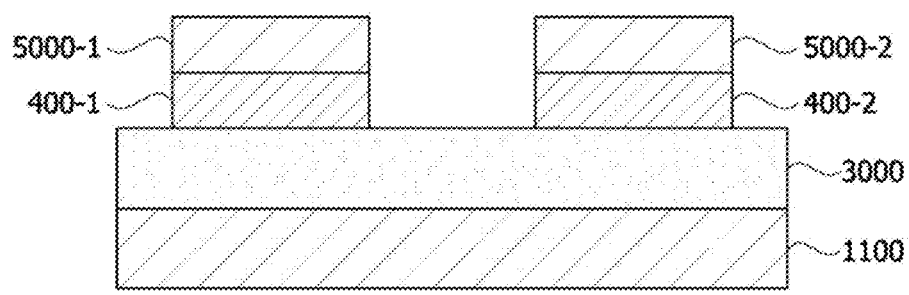

[FIG. 15]
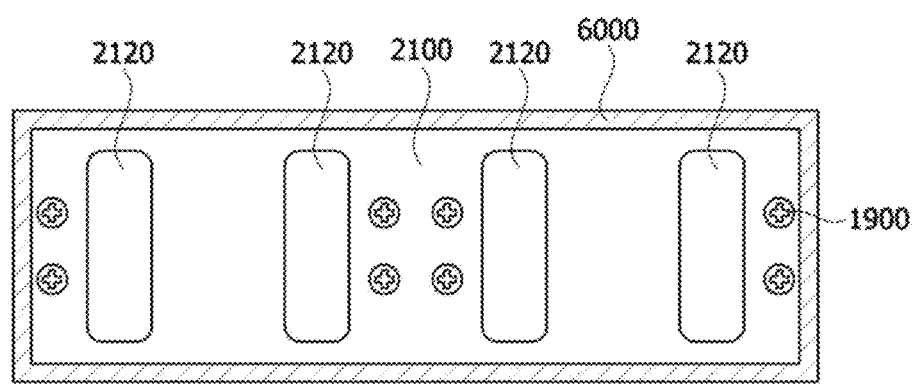

[FIG. 16]
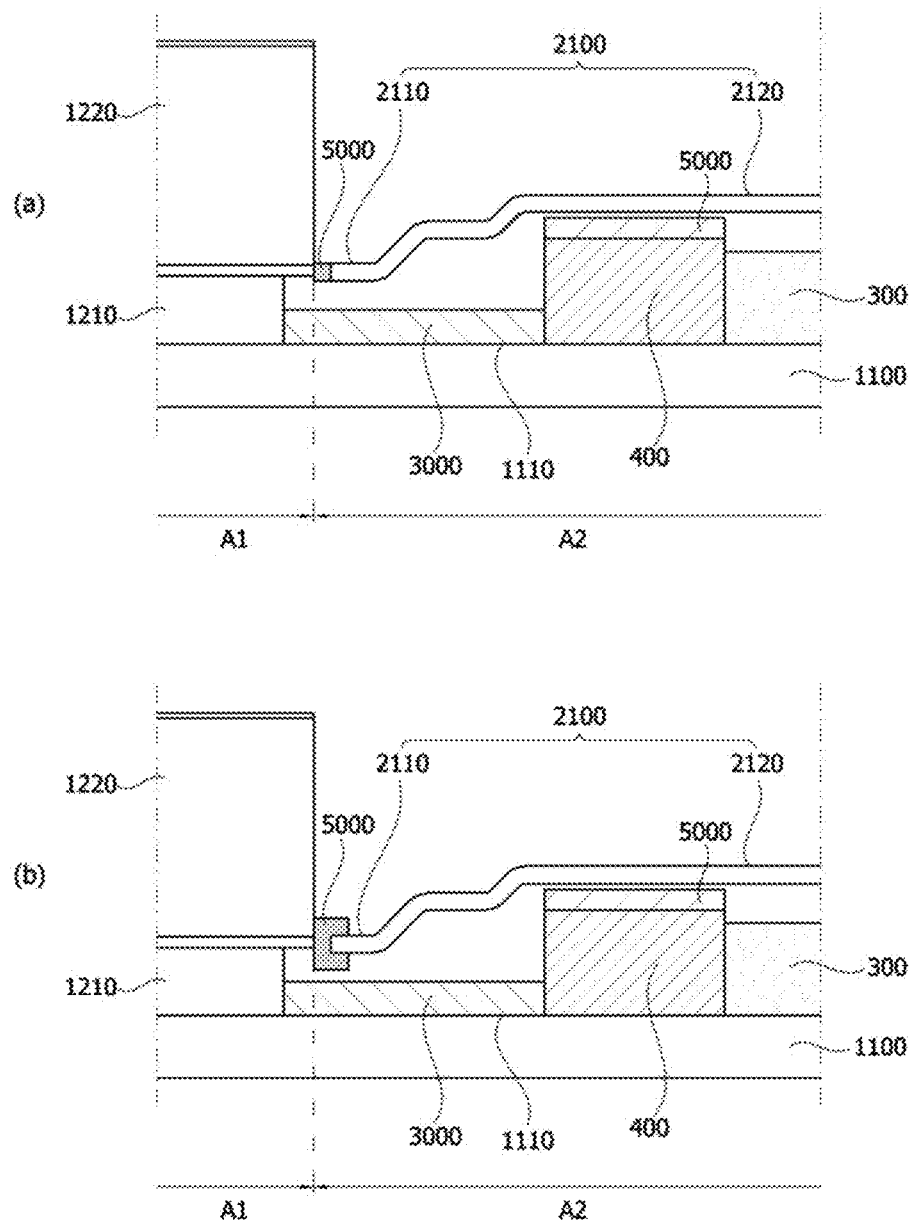

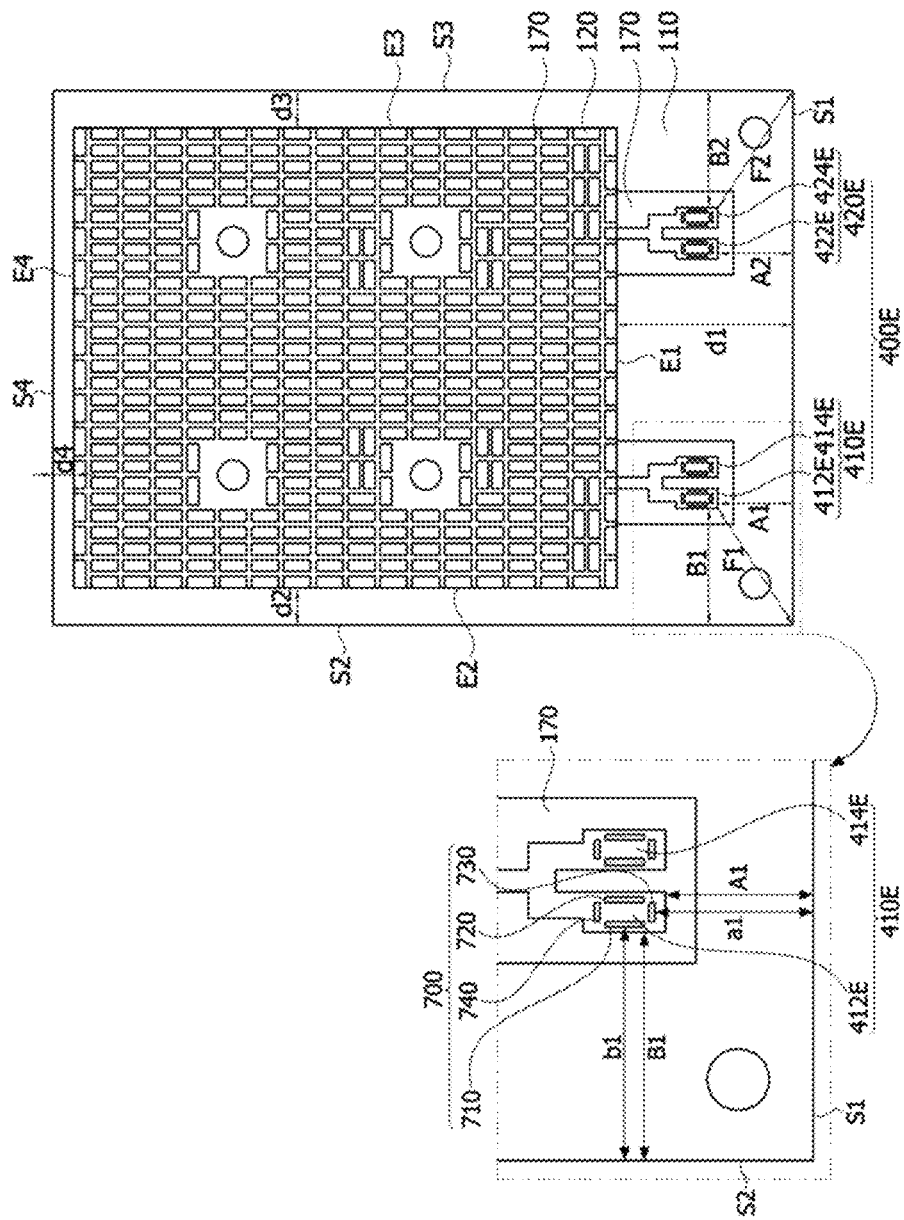
[FIG. 17]

[FIG. 18]
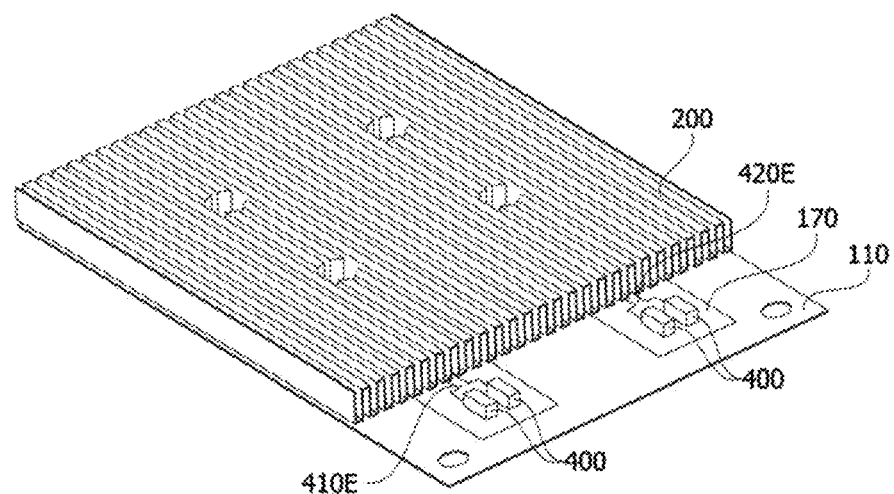
[FIG. 19]
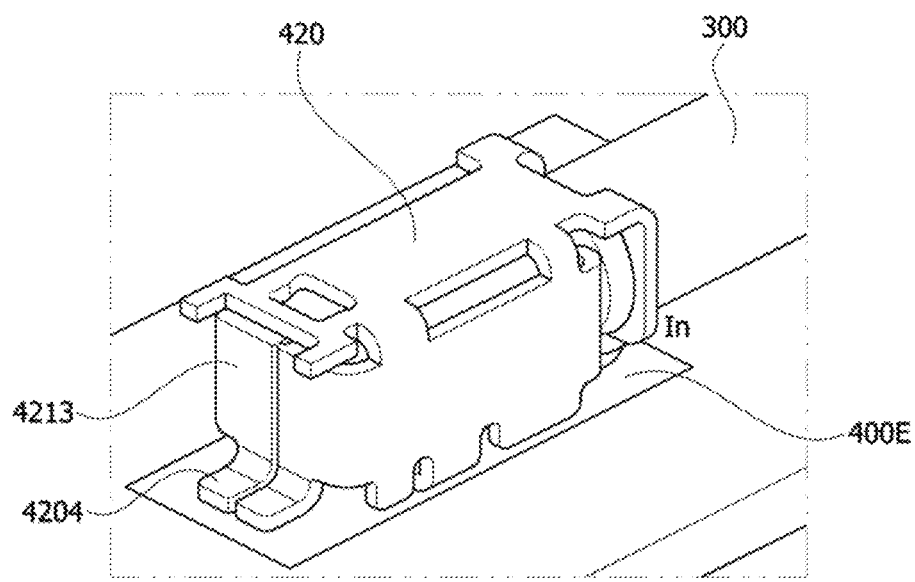

[FIG. 20]
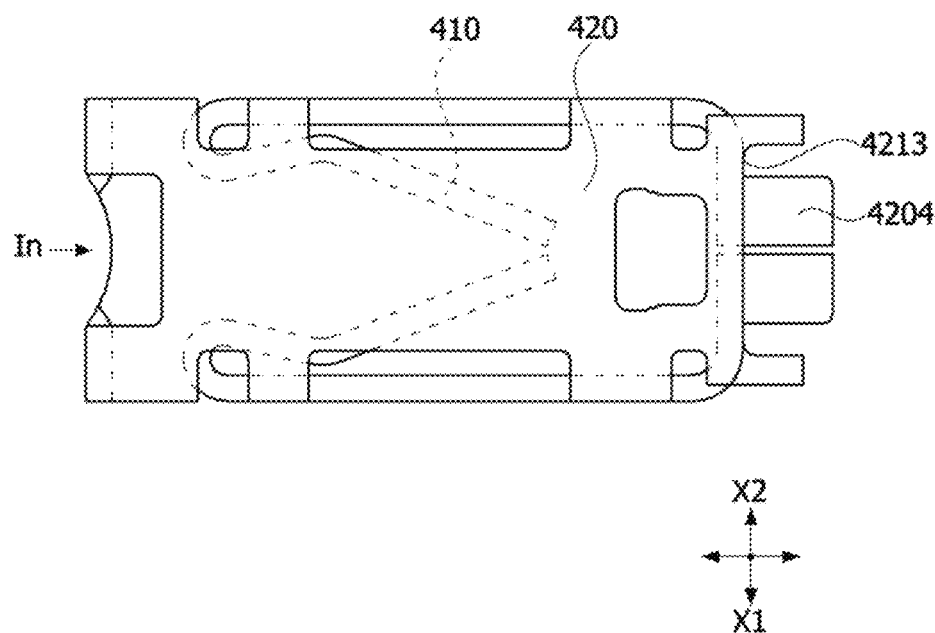
[FIG. 21]
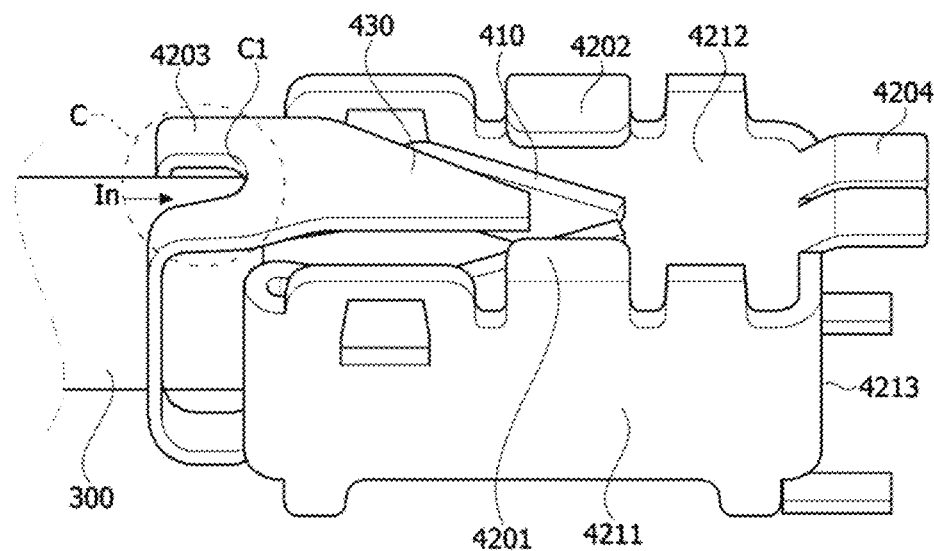

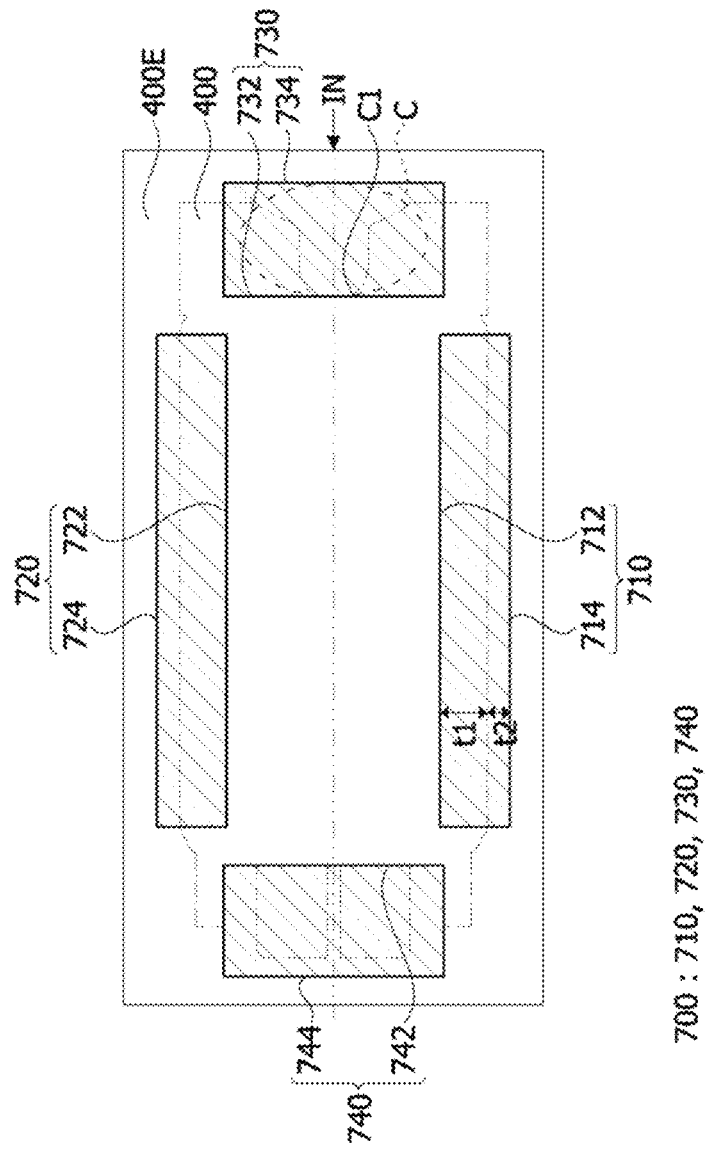
[FIG. 22]

POWER GENERATION DEVICE

CROSS REFERENCE TO RELATED APPLICATIONS

This application is the National Phase of PCT/KR2021/000480 filed on Jan. 13, 2021, which claims priority under 35 U.S.C. § 119(a) to Patent Application Nos. 10-2020-0006194 and 10-2020-0006195, both filed in the Republic of Korea on Jan. 16, 2020, all of which are hereby expressly incorporated by reference into the present application.

TECHNICAL FIELD

The present invention relates to a power generation device, and more specifically, to a power generation device that generates power using a temperature difference between a low temperature part and a high temperature part of a thermoelectric element.

BACKGROUND ART

A thermoelectric phenomenon is a phenomenon that occurs by the movement of electrons and holes inside a material and refers to direct energy conversion between heat and electricity.

Thermoelectric elements are a generic term for elements using the thermoelectric phenomenon, and have a structure in which a P-type thermoelectric material and an N-type thermoelectric material are bonded between metal electrodes to form a PN junction pair.

The thermoelectric elements may be classified into an element using a temperature change in electrical resistance, an element using the Seebeck effect, which is a phenomenon in which an electromotive force is generated by a temperature difference, and an element using the Peltier effect, which is a phenomenon in which heat is absorbed or heat is generated by a current.

The thermoelectric elements are variously applied to home appliances, electronic parts, communication parts, and the like. For example, the thermoelectric elements may be applied to a cooling device, a heating device, a power generation device, and the like. Accordingly, the demand for the thermoelectric performance of the thermoelectric element is gradually increasing.

Recently, there has been a need to generate electricity using hot waste heat generated from engines of vehicles, ships, or the like and thermoelectric elements. At this time, a duct through which a first fluid passes may be disposed at a low temperature part of the thermoelectric element, a heat dissipation fin may be disposed at a high temperature part of the thermoelectric element, and a second fluid may pass through the heat dissipation fin. Accordingly, electricity may be generated by the temperature difference between the low temperature part and the high temperature part of the thermoelectric element, and power generation performance may vary depending on the structure of the power generation device.

Technical Problem

The present invention is directed to providing a power generation device that generates power using a temperature difference between a low temperature part and a high temperature part of a thermoelectric element.

Technical Solution

A power generation device according to one embodiment of the present invention includes a cooling part, a thermoelectric module disposed in a first region on one surface of the cooling part, a connector part disposed in a second region on the one surface of the cooling part and connected to the thermoelectric module, a heat insulating member disposed on the connector part and disposed to expose a side surface of the connector part, a shield member disposed to cover the heat insulating member and the connector part, and a first insulating layer disposed between the connector part and the shield member.

A height of the connector part may be greater than a height of the heat insulating member with respect to the one surface of the cooling part.

The connector part may include a plurality of connectors disposed to be spaced apart from each other, and the first insulating layer may be a plurality of first insulating layers disposed for each connector.

The connector part may include a plurality of connectors disposed to be spaced apart from each other, and the first insulating layer may be integrally disposed on the plurality of connectors.

The first insulating layer may contain polyimide (PI).

The power generation device may further include a second insulating layer disposed between the thermoelectric module and a side surface of the shield member.

The shield member may include a first surface and a second surface having a height greater than that of the first surface, the second surface may be disposed on the connector part, and the second insulating layer may be disposed on a side surface of the first surface.

The second insulating layer may extend from the side surface of the first surface to at least one of a bottom surface of the first surface and an upper surface of the first surface.

The power generation device may further include a wire part connected to the connector part, in which the wire part may be disposed between the one surface of the cooling part and the heat insulating member in the second region.

The thermoelectric module may include a thermoelectric element including a first substrate, a first electrode disposed on the first substrate, a semiconductor structure disposed on the first electrode, a second electrode disposed on the semiconductor structure, and a second substrate disposed on the second electrode, and a connection electrode part disposed on the first substrate, the connector part may be disposed on the connection electrode part, and the connection electrode part may be disposed to be spaced apart from an outer edge of the first substrate by a predetermined distance or more.

A power generation device according to another embodiment of the present invention includes a cooling part, a first thermoelectric module and a second thermoelectric module disposed to be spaced apart from each other on one surface of the cooling part, a first connector part connected to the first thermoelectric module and a second connector part connected to the second thermoelectric module, which are disposed between the first thermoelectric module and the second thermoelectric module on the one surface of the cooling part, a heat insulating member disposed to expose at least a part of the first connector part and at least a part of the second connector part on side surfaces of the first connector part and the second connector part between the first thermoelectric module and the second thermoelectric module on the one surface of the cooling part, a shield member disposed to cover the heat insulating member, the first connector part, and the second connector part, and a first insulating layer disposed between the first connector part and the second connector part, and the shield member.

Each of the first connector part and the second connector part may include a plurality of connectors disposed to be spaced apart from each other, and the first insulating layer may be a plurality of first insulating layers disposed for each connector.

Each of the first connector part and the second connector part may include a plurality of connectors disposed to be spaced apart from each other, and the first insulating layer may be integrally disposed on the plurality of connectors included in the first connector part and the plurality of connectors included in the second connector part.

Each of the first connector part and the second connector part may include a plurality of connectors disposed to be spaced apart from each other, and the first insulating layer may include a plurality of first insulating layers integrally disposed on some of the plurality of connectors included in the first connector part and some of the plurality of connectors included in the second connector part.

Each of the first connector part and the second connector part may include a plurality of connectors disposed to be spaced apart from each other, and the first insulating layer may include a plurality of first insulating layers integrally disposed on the plurality of connectors included in the first connector part, and integrally disposed on some of the plurality of connectors included in the second connector part.

Each of the first connector part and the second connector part may include a plurality of connectors disposed to be spaced apart from each other, the shield member may include a first surface, and a plurality of second surfaces surrounded by the first surface and having a height greater than that of the first surface, one of the plurality of second surfaces may be disposed on some of the plurality of connectors included in the first connector part and some of the plurality of connectors included in the second connector part, the other of the plurality of second surfaces may be disposed on the others of the plurality of connectors included in the first connector part and the others of the plurality of connectors included in the second connector part, and the power generation device may further include a second insulating layer disposed between the side surface of the first surface and the first thermoelectric module and between the side surface of the first surface and the second thermoelectric module.

A thermoelectric apparatus according to one embodiment of the present invention includes a thermoelectric element, a connection electrode part electrically connected to the thermoelectric element, a plurality of bonding layers disposed on the connection electrode part, and a connector part disposed on the plurality of bonding layers, in which the plurality of bonding layers are disposed to be spaced apart from each other along a circumference of a bottom surface of the connector part.

The connection electrode part may include a first connection electrode and a second connection electrode spaced apart from the first connection electrode, the first connection electrode may be branched into a 1-1st connection electrode region and a 1-2nd connection electrode region, the second connection electrode may be branched into a 2-1st connection electrode region and a 2-2nd connection electrode region, and the plurality of bonding layers may be disposed in each of the 1-1st connection electrode region, the 1-2nd connection electrode region, the 2-1st connection electrode region, and the 2-2nd connection electrode region.

The connector part may include a plurality of connectors, and each connector may be disposed in each of the 1-1st connection electrode region, the 1-2nd connection electrode region, the 2-1st connection electrode region, and the 2-2nd connection electrode region.

A shortest distance in a first direction between the plurality of bonding layers and an outer edge of the thermoelectric element may be shorter than a shortest distance in a second direction between the plurality of bonding layers and the outer edge of the thermoelectric element, the first direction may be a direction in which the connection electrode part is connected to the thermoelectric element, and the second direction may be a direction perpendicular to the first direction.

A part of the bottom surface of the connector part may include a region having a concave shape, and one of the plurality of bonding layers may be disposed to correspond to the region having the concave shape.

The concave shape may be disposed between an inner surface and outer surface of the one bonding layer.

An outer surface of at least one of the plurality of bonding layers may be disposed at an outside of the bottom surface of the connector part.

A distance between the inner surface of at least one of the plurality of bonding layers and the outside of the bottom surface of the connector part may be greater than a distance between the outer surface of at least one of the plurality of bonding layers and the outside of the bottom surface of the connector part.

The power generation device may further include a wire part connected to the connector part, in which the connector part may include a first wire fixing member to which the wire part is fixed and a frame configured to accommodate the first wire fixing member, the first wire fixing member may move in a direction toward at least one of a first wall surface of the frame and a second wall surface of the frame facing the first wall surface when the wire part is attached or detached, and the plurality of bonding layers may include a first bonding layer disposed between a first bottom surface extending from the first wall surface and the connection electrode part, and a second bonding layer disposed between a second bottom surface extending from the second wall surface and spaced apart from the first bottom surface and the connection electrode part.

The connection electrode part and the first wire fixing member may be disposed to be spaced apart from each other between the first bonding layer and the second bonding layer spaced apart from each other.

The plurality of bonding layers may further include a third bonding layer disposed between a third bottom surface extending from a wire entry of the frame and the connection electrode part, and a fourth bonding layer disposed between a fourth bottom surface extending from a third wall surface facing the wire entry and spaced apart from the third bottom surface and the connection electrode part.

The connector part may further include a second wire fixing member extending from the third bottom surface, and the connection electrode part and the second wire fixing member may be disposed to be spaced apart from each other between the third bonding layer and the fourth bonding layer spaced apart from each other.

The total area of the plurality of bonding layers may be 80 to 120% of the total area of the first bottom surface, the second bottom surface, the third bottom surface, and the fourth bottom surface.

The plurality of bonding layers may have a thickness of 0.08 to 0.1 mm.

The thermoelectric element may include a first substrate, a first insulating layer disposed on the first substrate, a plurality of first electrodes disposed on the first insulating layer, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, a second insulating layer disposed on the plurality of second electrodes, and a second substrate disposed on the second insulating layer, the connection electrode part may be disposed on side surfaces of the plurality of first electrodes on the first substrate, and a bonding layer may be further disposed between the plurality of first electrodes, and the plurality of P-type thermoelectric legs and the plurality of N-type thermoelectric legs.

Each of the plurality of bonding layers disposed between the connection electrode part and the connector part and the bonding layers disposed between the plurality of first electrodes, and the plurality of P-type thermoelectric legs and the plurality of N-type thermoelectric legs may have a thickness of 0.8 to 0.1 mm. The plurality of bonding layers may be solder layers.

Advantageous Effects

According to an embodiment of the present invention, it is possible to obtain a power generation device with excellent power generation performance. In particular, according to the embodiment of the present invention, it is possible to obtain the power generation device that is simple to assemble and has excellent power generation performance by reducing the number of parts used and occupied volumes.

In addition, according to an embodiment of the present invention, it is possible to obtain a power generation device with improved heat transfer efficiency to a thermoelectric element. In addition, according to the embodiment of the present invention, it is possible to adjust power generation capacity by adjusting the number of power generation devices.

In addition, according to an embodiment of the present invention, it is possible to maximize an area where a second fluid and a heat dissipation fin of a thermoelectric module come into contact with each other, thereby maximizing power generation efficiency.

In addition, according to an embodiment of the present invention, it is possible to enhance insulation performance between a shield member and a thermoelectric module and a connector.

In addition, according to an embodiment of the present invention, it is possible to obtain a thermoelectric element with excellent performance and high reliability. In particular, according to the embodiment of the present invention, it is possible to obtain a bonding structure of a connector capable of satisfying both a printing thickness of the solder required between an electrode and a thermoelectric leg and a printing thickness of the solder required between a connection electrode and the connector.

DESCRIPTION OF DRAWINGS

FIG. 1 is a perspective view of a power generation device according to one embodiment of the present invention.

FIG. 2 is an exploded perspective view of the power generation device according to one embodiment of the present invention.

FIG. 3 is a top view of a state in which a shield member has been removed from the power generation device according to one embodiment of the present invention.

FIG. 4 is an enlarged view of a part of the power generation device according to one embodiment of the present invention.

FIGS. 5 and 6 are a cross-sectional view and a perspective view of a thermoelectric element according to one embodiment of the present invention.

FIG. 7 is a partial perspective view of the power generation device including the shield member according to one embodiment of the present invention.

FIG. 8 is a cross-sectional view around the shield member of the power generation device including the shield member according to one embodiment of the present invention.

FIG. 9 is a top view showing an arrangement structure of a first insulating layer according to one embodiment of the present invention.

FIG. 10 is a top view showing an arrangement structure of a first insulating layer according to another embodiment of the present invention.

FIG. 11 is a top view showing an arrangement structure of a first insulating layer according to still another embodiment of the present invention.

FIG. 12 is a cross-sectional view of the arrangement structure of the first insulating layer according to the embodiments of FIGS. 9 to 11.

FIG. 13 is a top view showing an arrangement structure of a first insulating layer according to yet another embodiment of the present invention.

FIG. 14 is a cross-sectional view of the arrangement structure of the first insulating layer according to the embodiment of FIG. 13.

FIG. 15 is a top view of a first shield member in which a second insulating layer is disposed according to the embodiment of the present invention.

FIG. 16 is a cross-sectional view of the first shield member in which the second insulating layer is disposed according to the embodiment of the present invention.

FIG. 17 is a top view of a substrate and an electrode included in the thermoelectric element according to the embodiment of the present invention.

FIG. 18 is a perspective view of a thermoelectric module in which a heat sink is disposed on the thermoelectric element according to the embodiment of the present invention.

FIG. 19 is a perspective view of a connector disposed on a connection electrode part and a wire connected to the connector according to the embodiment of the present invention.

FIG. 20 is a top view of the connector according to the embodiment of the present invention.

FIG. 21 is a rear perspective view of a state in which the wire is connected to the connector according to the embodiment of the present invention.

FIG. 22 shows an example of a pattern of a bonding layer disposed on a connection electrode according to one embodiment of the present invention.

MODES OF THE INVENTION

Hereinafter, exemplary embodiments of the present invention will be described in detail with reference to the accompanying drawings.

However, the technical spirit of the present invention is not limited to some embodiments described but may be implemented in various different forms, and one or more of the components may be used by being selectively coupled or substituted between the embodiments without departing from the technical spirit scope of the present invention.

In addition, terms (including technical and scientific terms) used in the embodiments of the present invention may be construed as the meaning that may be generally understood by those skilled in the art to which the present invention pertains, unless specifically defined and described explicitly, and the meaning of generally used terms such as terms defined in the dictionary may be construed in consideration of the contextual meaning of the related art.

In addition, the terms used in the embodiments of the present invention are intended to describe the embodiments and are not intended to limit the present invention.

In this specification, the singular form may also include the plural form unless otherwise specified in the phrase, and when it is described as "at least one (or one or more) of A and B, C," it may include one or more of all possible combinations of A, B, and C.

In addition, in describing the components of the embodiment of the present invention, terms such as first, second, A, B, (a), and (b) may be used.

These terms are only intended to distinguish the component from other components, and the essence, sequence, or order of the corresponding components is not limited by the terms.

In addition, when it is described that a component is "connected", "coupled", or "joined" to another component, this may include a case in which the component is not only directly connected, coupled, or connected to another component, but also a case in which the component is "connected", "coupled", or "joined" to another component through other components interposed therebetween.

In addition, when it is described as being formed or disposed on "top (above) or bottom (below)" of each component, the top (above) or bottom (below) includes not only a case in which two components come into direct contact with each other but also a case in which one or more other components are formed or disposed between the two components. In addition, when expressed as "top (above) or bottom (below)," this may also include the meaning of not only an upward direction but also a downward direction with respect to one component.

FIG. 1 is a perspective view of a power generation device according to one embodiment of the present invention, FIG. 2 is an exploded perspective view of the power generation device according to one embodiment of the present invention, FIG. 3 is a top view of a state in which a shield member has been removed from the power generation device according to one embodiment of the present invention, and FIG. 4 is an enlarged view of a part of the power generation device according to one embodiment of the present invention.

Referring to FIGS. 1 to 4, a power generation device 1000 includes a duct 1100, a first thermoelectric module 1200, a second thermoelectric module 1300, and a branch part 1400. A plurality of power generation devices 1000 may be disposed in parallel to be spaced apart from each other at a predetermined interval to form a power generation system. Although not shown, a second fluid may pass between two power generation devices 1000 disposed to be spaced apart from each other by the predetermined interval. For example, the second thermoelectric module 1300 of one power generation device 1000 and the first thermoelectric module 1200 of another power generation device 1000 adjacent thereto are disposed in parallel to be spaced apart from each other by the predetermined interval, and the second fluid may pass therebetween.

The power generation device 1000 according to an embodiment of the present invention may generate power using a temperature difference between a first fluid flowing through an inside of the duct 1100 and the second fluid passing through an outside of the duct 1100. In this specification, a temperature of the first fluid flowing through the inside of the duct 1100 may be lower than a temperature of the second fluid passing through heat dissipation fins of the thermoelectric modules 1200 and 1300 disposed outside the duct 1100. Accordingly, in this specification, the duct 1100 may be referred to as a cooling part.

To this end, the first thermoelectric module 1200 may be disposed on a first surface 1110 of the cooling part 1100, and the second thermoelectric module 1300 may be disposed on a second surface facing the first surface 1110 of the cooling part 1100. At this time, a surface disposed to face the cooling part 1100 of both surfaces of each of the first thermoelectric module 1200 and the second thermoelectric module 1300 is a low temperature part, and power may be generated by using the temperature difference between the low temperature part and the high temperature part. The branch part 1400 may be disposed on a third surface 1130 disposed perpendicular to the first surface 1110 and the second surface of the cooling part 1100, and the second fluid may be branched by the branch part 1400 to flow onto the first thermoelectric module 1200 and the second thermoelectric module 1300.

The first fluid introduced into the cooling part 1100 may be water, but is not limited thereto, and may be various types of fluids having cooling performance. The temperature of the first fluid introduced into the cooling part 1100 may be less than 100° C., preferably less than 50° C., and more preferably less than 40° C., but is not limited thereto. A temperature of the first fluid discharged after passing through the cooling part 1100 may be higher than the temperature of the first fluid introduced into the cooling part 1100.

The first fluid is introduced from a fluid inlet of the cooling part 1100 and discharged through a fluid outlet. In order to facilitate the introduction and discharge of the first fluid and support the cooling part 1100, an inlet flange (not shown) and an outlet flange (not shown) may be further disposed at the fluid inlet and the fluid outlet of the cooling part 1100, respectively. Alternatively, a plurality of fluid inlets (not shown) may be formed on a fourth surface 1140 disposed perpendicular to the first surface 1110, the second surface, and the third surface 1130 of the cooling part 1100, and a plurality of fluid outlets 1162 may be formed on a sixth surface 1160 facing the fourth surface 1140. The plurality of fluid inlets and fluid outlets 1162 may be connected to a plurality of fluid passing tubes (not shown) in the cooling part 1100. Accordingly, the first fluid introduced into each fluid inlet may pass through each fluid passing tube and then may be discharged from each fluid outlet 1162. Accordingly, even when a flow rate of the first fluid is not sufficient to fully fill an inside of the cooling part 1100 or a surface area of the cooling part 1100 is increased, the first fluid may be uniformly distributed in the cooling part 1100, so that it is possible to obtain uniform thermoelectric conversion efficiency with respect to an entire surface of the cooling part 1100, and to omit the inlet flange and the outlet flange.

At this time, each fluid inlet may be connected to a fluid inflow tube 1182 through a first fitting member (not shown), and each fluid outlet 1162 may be connected to a fluid discharge tube 1192 through a second fitting member (not shown).

Here, the fluid inflow tube 1182 and the fluid discharge tube 1192 may be disposed to protrude from the fourth surface 1140 and the sixth surface 1160 of the cooling part 1100.

Although not shown, heat dissipation fins may be disposed on an inner wall of the cooling part 1100. The shape and number of heat dissipation fins, and the area of the heat dissipation fins occupying the inner wall of the cooling part 1100 may be variously changed depending on the temperature of the first fluid, the temperature of the second fluid, the required power generation capacity, and the like. The area of the heat dissipation fins occupying the inner wall of the cooling part 1100 may be, for example, 1 to 40% of a cross-sectional area of the cooling part 1100. Accordingly, it is possible to obtain high thermoelectric conversion efficiency without interfering with the flow of the first fluid. At this time, the heat dissipation fin may have a shape that does not interfere with the flow of the first fluid. For example, the heat dissipation fin may be formed in a direction in which the first fluid flows. In other words, the heat dissipation fin may have a plate shape extending in a direction from the fluid inlet toward the fluid outlet, and the plurality of heat dissipation fins may be disposed to be spaced apart from each other by a predetermined interval. The heat dissipation fins may be formed integrally with the inner wall of the cooling part 1100.

Meanwhile, the first thermoelectric module 1200 may be disposed on the first surface 1110 of the cooling part 1100, and the second thermoelectric module 1300 may be disposed to be symmetrical to the first thermoelectric module 1200 on the second surface of the cooling part 1100.

The first thermoelectric module 1200 and the second thermoelectric module 1300 may be fastened to the cooling part 1100 using a screw. Accordingly, the first thermoelectric module 1200 and the second thermoelectric module 1300 may be stably coupled to the surface of the cooling part 1100. Alternatively, at least one of the first thermoelectric module 1200 and the second thermoelectric module 1300 may also be bonded to the surface of the duct 1100 using a thermal interface material (TIM). Here, the thermal interface material (TIM) is a material having heat transfer performance and bonding performance, and may be, for example, a resin composition containing at least one of an epoxy resin and a silicone resin and an inorganic material. Here, the inorganic material may be oxide, carbide, or nitride of aluminum, boron, or silicon.

Meanwhile, each of the first thermoelectric module 1200 and the second thermoelectric module 1300 includes thermoelectric elements 1210 and 1310 disposed on each of the first surface 1110 and the second surface and heat dissipation fins 1220 and 1320 disposed on the thermoelectric elements 1210 and 1310. As described above, when the cooling part 1100 through which the first fluid flows is disposed on one surface of both surfaces of each of the thermoelectric elements 1210 and 1310, the heat dissipation fins 1220 and 1320 are disposed on the other surface, and the second fluid passes through the heat dissipation fins 1220 and 1320, it is possible to increase the temperature difference between heat absorption surfaces and heat dissipation surfaces of the thermoelectric elements 1210 and 1310, thereby enhancing thermoelectric conversion efficiency. At this time, a direction in which the first fluid flows and a direction in which the second fluid flows may be different. For example, the direction in which the first fluid flows and the direction in which the second fluid flows may be substantially perpendicular. At this time, the temperature of the second fluid introduced into the power generation device is higher than the temperature of the second fluid discharged after passing through the heat dissipation fin included in the thermoelectric module of the power generation device. For example, the second fluid introduced into the power generation device may be waste heat generated from engines of automobiles or ships, but is not limited thereto. For example, the temperature of the second fluid introduced into the power generation device may be 100° C. or more, preferably, 200° C. or more, and more preferably, 220° C. to 250° C., but is not limited thereto.

At this time, referring to FIG. 4, the heat dissipation fins 1220 and 1320 and the thermoelectric elements 1210 and 1310 may be fastened by a plurality of fastening members 1230 and 1330. To this end, at least some of the heat dissipation fins 1220 and 1320 and the thermoelectric elements 1210 and 1310 may be formed with through holes S through which the fastening members 1230 and 1330 pass. Here, separate insulators 1240 and 1340 may be further disposed between the through holes S and the fastening members 1230 and 1330. The separate insulators 1240 and 1340 may be insulators surrounding outer circumferential surfaces of the fastening members 1230 and 1330 or insulators surrounding wall surfaces of the through holes S. For example, the insulators 1240 and 1340 may have a ring shape. Inner circumferential surfaces of the insulators 1240 and 1340 having the ring shape may be disposed on the outer circumferential surfaces of the fastening members 1230 and 1330, and outer circumferential surfaces of the insulators 1240 and 1340 may be disposed on inner circumferential surfaces of the through holes S. Accordingly, the fastening members 1230 and 1330 and the heat dissipation fins 1220 and 1320 and the thermoelectric elements 1210 and 1310 may be insulated.

At this time, structures of the thermoelectric elements 1210 and 1310 may have the structure of a thermoelectric element 100 shown in FIGS. 5 and 6. Referring to FIGS. 5 and 6, the thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrodes 120 and the upper electrodes 150. A pair of P-type thermoelectric leg 130 and N-type thermoelectric leg 140 disposed between the lower electrode 120 and the upper electrode 150 and electrically connected may form a unit cell.

For example, when a voltage is applied to the lower electrode 120 and the upper electrode 150 through lead wires 181 and 182, a substrate in which a current flows from the P-type thermoelectric leg 130 to the N-type thermoelectric leg 140, due to the Peltier effect, may function as a cooling part by absorbing heat, and a substrate in which a current flows from the N-type thermoelectric leg 140 to the P-type thermoelectric leg 130 may function as a heat-generation part by being heated. Alternatively, when a temperature difference between the lower electrode 120 and the upper electrode 150 is applied, charges in the P-type thermoelectric leg 130 and the N-type thermoelectric leg 140 move due to the Seebeck effect, and electricity may also be generated.

Here, the P-type thermoelectric leg 130 and the N-type thermoelectric leg 140 may be bismuth telluride (Bi—Te)-based thermoelectric legs including bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain 99 to 99.999 wt % of Bi—Sb—Te, which is a main raw material, and contain 0.001 to 1 wt % of at least one of nickel (Ni), aluminum (Al), copper (Cu), silver (Ag), lead (Pb), boron (B), gallium (Ga), and indium (In) based on 100 wt % of the total weight. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain 99 to 99.999 wt % of Bi—Se—Te, which is a main raw material, and contain 0.001 to 1 wt % of at least one of nickel (Ni), aluminum (Al), copper (Cu), silver (Ag), lead (Pb), boron (B), gallium (Ga), and indium (In) based on 100 wt % of the total weight. In this specification, the thermoelectric leg may also be referred to as a semiconductor structure, a semiconductor device, a semiconductor substance layer, a semiconductor material layer, a semiconductor matter layer, a conductive semiconductor structure, a thermoelectric structure, a thermoelectric substance layer, a thermoelectric material layer, a thermoelectric matter layer, and the like.

The P-type thermoelectric leg 130 and the N-type thermoelectric leg 140 may be formed in a bulk-type or a stack-type. In general, the bulk-type P-type thermoelectric leg 130 or the bulk-type N-type thermoelectric leg 140 may be obtained through a process of manufacturing an ingot by heat-treating a thermoelectric material, acquiring powder for a thermoelectric leg by grinding and sieving the ingot, sintering the powder, and cutting a sintered body. At this time, the P-type thermoelectric leg 130 and the N-type thermoelectric leg 140 may be polycrystalline thermoelectric legs. As described above, when the P-type thermoelectric leg 130 and the N-type thermoelectric leg 140 are polycrystalline thermoelectric legs, strengths of the P-type thermoelectric leg 130 and the N-type thermoelectric leg 140 may be increased. The stack-type P-type thermoelectric leg 130 or the stack-type N-type thermoelectric leg 140 may be obtained through a process of forming a unit member by applying a paste including a thermoelectric material on a sheet-shaped base material, and then stacking and cutting the unit member.

At this time, the pair of P-type thermoelectric leg 130 and N-type thermoelectric leg 140 may have the same shape and volume, or different shapes and volumes. For example, since electrical conductive characteristics of the P-type thermoelectric leg 130 and the N-type thermoelectric leg 140 are different, a height or cross-sectional area of the N-type thermoelectric leg 140 may also be formed differently from a height or cross-sectional area of the P-type thermoelectric leg 130.

At this time, the P-type thermoelectric leg 130 or the N-type thermoelectric leg 140 may have a cylindrical shape, a polygonal column shape, an elliptical column shape, or the like.

The performance of the thermoelectric element according to the embodiment of the present invention may be represented as a figure of merit (ZT). The figure of merit (ZT) may be represented as in Equation 1.

$$ZT = \alpha^2 \cdot \sigma \cdot T/k \qquad \text{[Equation 1]}$$

where α refers to a Seebeck coefficient [V/K], σ refers to the electrical conductivity [S/m], and $\alpha^2\sigma$ refers to a power factor [W/mK$^2$]. In addition, T refers to a temperature, and k refers to the thermal conductivity [W/mK]. k may be represented as a·cp·ρ, a refers to the thermal diffusivity [cm$^2$/S], cp refers to the specific heat [J/gK], and ρ refers to a density [g/cm$^3$].

To obtain the figure of merit of the thermoelectric element, a Z value (V/K) may be measured by using a Z meter, and the figure of merit (ZT) may be calculated by using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may contain at least one of copper (Cu), silver (Ag), aluminum (Al), and nickel (Ni), and have a thickness of 0.01 mm to 0.3 mm. When the lower electrode 120 or the upper electrode 150 has a thickness of less than 0.01 mm, a function as an electrode may be degraded, thereby reducing the electrical conduction performance, and when the lower electrode 120 or the upper electrode 150 has a thickness of more than 0.3 mm, conduction efficiency may be reduced due to an increase in resistance.

In addition, the lower substrate 110 and the upper substrate 160 facing each other may be metal substrates, and may have a thickness of 0.1 mm to 1.5 mm. When the metal substrate has a thickness of less than 0.1 mm or more than 1.5 mm, heat dissipation characteristics or thermal conductivity may be excessively increased, thereby reducing the reliability of the thermoelectric element. In addition, when the lower substrate 110 and the upper substrate 160 are the metal substrates, insulating layers 170 may be further formed between the lower substrate 110 and the lower electrode 120 and between the upper substrate 160 and the upper electrode 150. The insulating layer 170 may include a material having a thermal conductivity of 1 to 20 W/mK. At this time, the insulating layer 170 may be a resin composition containing at least one of an epoxy resin and a silicone resin and an inorganic material, a layer made of a silicone composite containing silicone and an inorganic material, or an aluminum oxide layer. Here, the inorganic material may be at least one of oxide, nitride, and carbide of aluminum, boron, or silicon.

At this time, the sizes of the lower substrate 110 and the upper substrate 160 may also be differently formed. In other words, the volume, thickness, or area of one of the lower substrate 110 and the upper substrate 160 may be formed greater than the volume, thickness, or area of the other. Here, the thickness may be a thickness in a direction from the lower substrate 110 toward the upper substrate 160, and the area may be an area in a direction perpendicular to a direction from the substrate 110 toward the upper substrate 160. Accordingly, it is possible to improve heat absorption performance or heat dissipation performance of the thermoelectric element. Preferably, the volume, thickness, or area of the lower substrate 110 may be formed greater than at least one of the volume, thickness, or area of the upper substrate 160. At this time, at least one of the volume, thickness, or the area of the lower substrate 110 may be greater than that of the upper substrate 160 when the lower substrate 110 is disposed in a high temperature area for the Seebeck effect, when the lower substrate 110 is applied to a heat-generation area for the Peltier effect, or when a sealing member configured to protect the thermoelectric element from external environments to be described below is disposed on the lower substrate 110. At this time, the area of the lower substrate 110 may be formed in a range of 1.2 to 5 times the area of the upper substrate 160. When the area of the lower substrate 110 is formed to be less than 1.2 times that of the upper substrate 160, the influence on the improvement of heat transfer efficiency is not high, and when the area of the lower substrate 110 exceeds 5 times, the heat transfer efficiency is rather reduced significantly, and it may be difficult to maintain the basic shape of the thermoelectric module.

In addition, a heat dissipation pattern, for example, an uneven pattern, may also be formed on the surface of at least one of the lower substrate 110 and the upper substrate 160. Accordingly, it is possible to improve the heat dissipation performance of the thermoelectric element. When the uneven pattern is formed on a surface coming into contact with the P-type thermoelectric leg 130 or the N-type thermoelectric leg 140, bonding characteristics between the thermoelectric leg and the substrate may also be improved. The thermoelectric element 100 includes the lower substrate 110, the lower electrode 120, the P-type thermoelectric leg 130, the N-type thermoelectric leg 140, the upper electrode 150, and the upper substrate 160.

Although not shown, a sealing member may be further disposed between the lower substrate 110 and the upper substrate 160. The sealing member may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like.

At this time, the lower substrate 110 disposed on the cooling part 1100 may be an aluminum substrate, and the aluminum substrate may be bonded to each of the first surface 1110 and the second surface by the thermal interface material (TIM). Since the aluminum substrate has excellent heat transfer performance, the heat transfer between one surface of both surfaces of each of the thermoelectric elements 1210 and 1310 and the cooling part 1100 through which the first fluid flows is easy. In addition, when the aluminum substrate and the cooling part 1100 through which the first fluid flows are bonded by the thermal interface material (TIM), the heat transfer between the aluminum substrate and the cooling part 1100 through which the first fluid flows may not be interrupted.

Meanwhile, in the embodiment of the present invention, a plurality of first thermoelectric modules 1200 disposed on the first surface 1110 of the cooling part 1100 may be provided, and a plurality of second thermoelectric modules 1300 disposed on the second surface of the cooling part 1100 may be provided. The size and number of thermoelectric modules may be adjusted according to the required amount of power generation.

At this time, at least some of the plurality of first thermoelectric modules 1200 disposed on the first surface 1110 of the cooling part 1100 may be electrically connected to each other, and at least some of the plurality of second thermoelectric modules 1300 disposed on the second surface of the cooling part 1100 may be electrically connected to each other. To this end, a wire is connected to some of a plurality of electrodes included in each thermoelectric element and drawn out to the outside of each thermoelectric element, and the drawn-out wire may be connected to a connector disposed outside each thermoelectric element.

Meanwhile, the wire and the connector are vulnerable to external heat or moisture, and when the second fluid passing through the heat dissipation fin comes into direct contact with the wire and the connector, the wire and the connector may be damaged. Accordingly, the power generation device according to the embodiment of the present invention may further include a shield member configured to cover the wire and the connector. However, when the shield member is disposed between the thermoelectric modules, the shield member may also interfere with the flow path of the second fluid. The embodiment of the present invention is directed to providing a structure of the shield member capable of covering the wire and the connector without interfering with the flow path of the second fluid.

The power generation device according to the embodiment of the present invention may include a first shield member 2100 disposed between two adjacent first thermoelectric modules 1200-1 and 1200-2 among the plurality of first thermoelectric modules 1200, and a second shield member 2200 disposed between two adjacent second thermoelectric modules 1300-1 and 1300-2 among two adjacent second thermoelectric modules 1300 among the plurality of second thermoelectric modules 1300.

FIG. 7 is a partial perspective view of the power generation device including the shield member according to one embodiment of the present invention, and FIG. 8 is a cross-sectional view of a region R of the power generation device in FIG. 7.

Overlapping descriptions of the same contents as those described with reference to FIGS. 1 to 6 will be omitted. For convenience of description, the first shield member between the plurality of first thermoelectric modules disposed on the first surface of the cooling part will be described as an example, but the same structure may also be applied to the second shield member.

Referring to FIGS. 1 to 3, 7, and 8, the plurality of first thermoelectric modules 1200 are disposed on the first surface 1110 of the cooling part 1100. Each of the plurality of first thermoelectric modules 1200 includes the thermoelectric element 1210 disposed on the first surface 1110 and the heat dissipation fin 1220 disposed on the thermoelectric element 1210. In addition, a connector 400 is disposed on a connection electrode (not shown) connected to the thermoelectric element 1210 of each first thermoelectric module 1200, and a wire 300 is connected to the connector 400. Here, the wire 300 may correspond to the lead wires 181 and 182 in FIG. 6.

According to the embodiment of the present invention, the first shield member 2100 may be disposed between one first thermoelectric module 1200-1 and the other adjacent thermoelectric module 1200-2, and the first shield member 2100 may cover the wire 300 and the connector 400 between the one first thermoelectric module 1200-1 and the other adjacent first thermoelectric module 1200-2. Accordingly, the wire 300 and the connector 400 may be disposed between the first surface 1110 of the cooling part 1100 and the first shield member 2100.

At this time, a heat insulating member 3000 may be further disposed between the first surface 1110 of the cooling part 1100 and the first shield member 2100. Accordingly, since heat insulation between the first fluid in the cooling part 1100 and the second fluid on the first shield member 2100 can be maintained, it is possible to maximize the temperature difference between the low temperature part and the high temperature part of the thermoelectric module, and enhance the power generation performance of the power generation device.

Accordingly, the second fluid passing through the power generation device according to the embodiment of the present invention may flow to sequentially pass through a first heat dissipation fin 1220-1 of the one first thermoelectric module 1200-1 of the two adjacent first thermoelectric modules 1200-1 and 1200-2, the first shield member 2100, and a second heat dissipation fin 1220-2 of the other first thermoelectric module 1200-2 of the two adjacent first thermoelectric modules 1200-1 and 1200-2. The direction in which the second fluid flows may be a second direction perpendicular to a first direction in which the first fluid is introduced into and discharged from the cooling part 1100.

In this specification, for convenience of description, the first shield member 2100 will be mainly described, but the same structure may also be applied to the second shield member 2200. The first shield member 2100 may be coupled to the cooling part 1100 using the coupling member 1900. At this time, in order to couple the first shield member 2100, the cooling part 1100, and the second shield member 2200 together, the plurality of coupling members 1900 may be disposed to be symmetrical to the first shield member 2100 and the second shield member 2200, and the cooling part 1100 and the heat insulating member 300 may be formed with a through hole h through which the coupling member 1900 passes.

At this time, the first shield member 2100 according to the embodiment of the present invention includes a first surface 2110 and a second surface 2120 having a height greater than that of the first surface 2110. In addition, the first shield member 2100 may further include a third surface 2130 having a height greater than the height of the first surface 2110 and a height lower than the height of the second surface 2120.

At this time, the first surface 2110 may be disposed at a height that is the same as a bottom surface 1222 of the heat dissipation fin 1220 or lower than the bottom surface 1222. When the first shield member 2100 is disposed between two adjacent first thermoelectric modules 1200-1 and 1200-2, the first surface 2110 of the first shield member 2100 may be formed to be symmetrical between the two adjacent first thermoelectric modules 1200-1 and 1200-2. Accordingly, the second fluid passing through the first heat dissipation fin 1220-1 may be introduced into the second heat dissipation fin 1220-2 along the first shield member 2100 without the flow being interrupted.

In addition, the third surface 2130 may be disposed at a height greater than that of the wire 300, and the second surface 2120 may be disposed at a height greater than those of the wire 300 and the connector 400. For example, the maximum height of the second surface 2120 may be disposed to be 0.25 times, preferably, 0.2 times, and more preferably, 0.18 times or less a height difference H between the bottom surface 1222 and a top surface 1224 of the heat dissipation fin 1220 from the bottom surface 1222 of the heat dissipation fin 1220. Accordingly, since an area covered by the second surface 2120 of the first heat dissipation fin 1220-1 and the second heat dissipation fin 1220-2 can be minimized, the flow of the second fluid may not be interrupted.

At this time, an area of the third surface 2130 may be larger than an area of the second surface 2120. In other words, the second surface 2120 may be formed to cover the connector 400, and all regions other than the first surface 2110 and the second surface 2120 may be the third surface 2130. The first surface 2110 may be formed along the first heat dissipation fin 1220-1 and the second heat dissipation fin 1220-2. In addition, a second surface 2120-1 may be formed to cover a first connector 400-1 to which a wire of one of a first polarity and a second polarity connected to one first thermoelectric module 1200-1 is connected and a second connector 400-5 to which a wire of one of the first polarity and the second polarity connected to the other first thermoelectric module 1200-2 is connected. In addition, a second surface 2120-2 may be formed to cover a third connector 400-2 to which a wire of the other of the first polarity and the second polarity connected to one first thermoelectric module 1200-1 is connected and a fourth connector 400-6 to which a wire of the other of the first polarity and the second polarity connected to the other first thermoelectric module 1200-2 is connected. As described above, the second surface 2120 may include a plurality of second surfaces 2120-1 and 2120-2 spaced apart from each other. Here, the first connector and the second connector may be one connector or separate connectors, and the third connector and the fourth connector may be one connector or separate connectors.

In addition, all regions of the first shield member 2100 other than the first surface 2110 and the second surface 2120 may be the third surface 2130. When the second surface 2120 includes the plurality of second surfaces spaced apart from each other, the third surface 2130 may be disposed between the two second surfaces 2120-1 and 2120-2 spaced apart from each other. Accordingly, since the area of the second surface 2120 can be minimized, the first shield member 2100 may not interfere with the flow path of the second fluid from the first heat dissipation fin 1220-1 to the second heat dissipation fin 1220-2.

Meanwhile, in the embodiment of the present invention, a first connection surface 2140 connecting the first surface 2110 and the third surface 2130 and a second connection surface 2150 connecting the third surface 2130 and the second surface 2120 are included.

Here, the first connection surface 2140 may be inclined at an angle θ1 greater than 0° and smaller than 90°, preferably, an angle greater than 10° and smaller than 75°, and more preferably, an angle greater than 20° and smaller than 60° with respect to the first surface 2110. Likewise, the second connection surface 2150 may be inclined at an angle θ2 greater than 0° and smaller than 90°, preferably, an angle greater than 10° and smaller than 75°, and more preferably, an angle greater than 20° and smaller than 60° with respect to the second surface 2120. Accordingly, the gas passing through the first heat dissipation fin 1220-1 may be introduced into the second heat dissipation surface 1220-2 along the first shield member 2100 without large resistance.

Meanwhile, when the third surface 2130 is disposed between the two second surfaces 2120-1 and 2120-2 spaced apart from each other, the second connection surfaces 2150-1 and 2150-2 may be disposed symmetrically so that a second connection surface 2150-1 connects the third surface 2130 and the second surface 2120-1, and a second connection surface 2150-2 connects the third surface 2130 and the second surface 2120-2.

Meanwhile, in the power generation device according to the embodiment of the present invention, the first thermoelectric module 1200 is disposed in a first region A1 of the first surface 1110 of the cooling part 1100, the connector 400 connected to the first thermoelectric module 1200 is disposed in a second region A2 of the first surface 1110 of the cooling part 1100, and the heat insulating member 3000 is disposed in the second region A2 of the first surface 1110 of the cooling part 1100. In addition, the first shield member 2100 may be disposed in the second region A2 of the second surface 1110 of the cooling part 1100 to cover the heat insulating member 3000 and the connector 400.

In general, when the heat insulating member 3000 is disposed to cover the connector 400, a height of the heat insulating member 3000 becomes higher than necessary, and thus a flow resistance may occur in the second fluid passing through the first heat sink 1220 of the first thermoelectric module 1200. In order to solve this problem, the height of the heat insulating member 3000 with respect to the first surface 1110 of the cooling part 1100 may be disposed lower than the height of the connector 400. Accordingly, at least a part of the connector 400 may be exposed to the second surface 2120 of the first shield member 2100 without being covered by the heat insulating member 3000. In other words, the heat insulating member 3000 is not disposed between the connector 400 and an inner surface of the second surface 2120 of the first shield member 2100, and an upper surface of the connector 400 and the inner surface of the second surface 2120 of the first shield member 2100 may be disposed to face each other, or come into contact with each other.

For example, the heat insulating member 3000 may be disposed on a side surface of the connector 400 in the second region A2 of the first surface 1110. At this time, the heat insulating member 3000 may not be disposed between the connector 400 and the first shield member 2100. In other words, a hole through which the connector 400 passes may also be formed on the heat insulating member 3000. Accordingly, since the height of the first shield member 2100 does not increase due to the heat insulating member 3000, the influence of the heat insulating member 3000 on the flow of the second fluid can be removed.

In general, the first shield member 2100 may be made of a metal material due to reasons such as heat resistance, cost, and compatibility. Likewise, since the connector 400 is disposed on the connection electrode of the thermoelectric element, at least a part of the connector 400 may be made of a metal material. Accordingly, when the first shield member 2100 is disposed to cover the heat insulating member 3000 and the connector 400, the first shield member 2100 and the connector 400 may be electrically conducted.

In the embodiment of the present invention, as shown in FIG. 8, a first insulating layer 5000 is disposed between the connector 400 and the first shield member 2100. Accordingly, the electrical conduction between the connector 400 and the first shield member 2100 may be prevented. Although FIG. 8 shows that the second surface 2120 of the shield member 2100 and the first insulating layer 5000 are spaced apart from each other, the present invention is not limited thereto, and at least a part of the first insulating layer 5000 may also come into contact with the second surface 2120 of the shield member 2100.

FIG. 9 is a top view showing an arrangement structure of a first insulating layer according to one embodiment of the present invention, FIG. 10 is a top view showing an arrangement structure of a first insulating layer according to another embodiment of the present invention, FIG. 11 is a top view showing an arrangement structure of a first insulating layer according to still another embodiment of the present invention, and FIG. 12 is a cross-sectional view of the arrangement structure of the first insulating layer according to the embodiments of FIGS. 9 to 11.

Referring to FIGS. 9 to 12, the heat insulating member 3000 and the plurality of connectors 400 may be disposed in the second region A2 of the cooling part 1100. The through hole h through which the coupling member 1900 passes may be formed in the heat insulating member 3000. At this time, the heights of the plurality of connectors 400 with respect to the cooling part 1100 may be greater than the height of the heat insulating member 3000. Meanwhile, the connector 400 may include the plurality of connectors disposed to be spaced apart from each other. Each of the first thermoelectric modules 1200 may be connected to at least two connectors 400. As shown in FIG. 3, when four first thermoelectric modules 1200-1, 1200-2, 1200-3, and 1200-4 are disposed on the first surface 1110 of the cooling part 1100, at least eight connectors 400 may be disposed in the second region A2 of the first surface 1110 of the cooling part 1100.

At this time, the first insulating layer 5000 may be disposed on the plurality of connectors 400. Accordingly, the electrical conduction between the plurality of connectors 400 and the first shield member 2100 may be prevented.

Here, the first insulating layer 5000 may contain polyimide (PI). Accordingly, the first insulating layer having excellent fire resistance, heat resistance, and insulating property can be obtained. Here, the first insulating layer 5000 may have the form of a polyimide film, a polyimide tape, a polyimide resin, or a sol-gel polyimide-silica composite. In addition, the first insulating layer 5000 may have a thickness of 1 to 15 μm, preferably, 3 to 10 μm, and more preferably, 5 to 10 μm. When the first insulating layer 5000 has a thickness that satisfies this numerical range, fire resistance, heat resistance, and insulating property are excellent, and a problem that a flow resistance occurs in the second fluid due to the addition of the first insulating layer 5000 can be prevented.

As described above, when the first insulating layer 5000 is further disposed between the connector 400 and the first shield member 2100, it is possible to prevent the electrical conduction between the connector 400 and the first shield member 2100. In addition, when the first insulating layer 5000 has fire resistance and heat resistance, the first insulating layer 5000 may also insulate between the high temperature second fluid moving on the first shield member 2100 and the connector 400.

Meanwhile, the first insulating layer 5000 may further include other heat-resistant polymers in addition to polyimide. For example, the first insulating layer 5000 may further contain at least one selected from the group consisting of polyacetal, polycarbonate, acetal copolymer, polyphenylene oxide, polyphenylene ether, polysulfone, nylon, polyphenylene sulfide, polybutylene terephthalate, polyarylate, polyamide imide, polyester sulfone, liquid crystal polyester, polyarylate, polyether ether ketone, polyether imide, aromatic polyether ketone, polyether nitrile, polyaryl ether ketone, polyketone sulfide, polythioether sulfone, polystriylpyrimidine, and polyarylsulfide.

For example, referring to FIGS. 3 and 9, in a 1-1st thermoelectric module 1200-1 and a 1-3rd thermoelectric module 1200-3 disposed adjacent to each other in the direction in which the first fluid passes, one first insulating layer 5000-1 may be integrally disposed on two connectors 400-1 and 400-2 connected to the 1-1st thermoelectric module 1200-1 and two connectors 400-3 and 400-4 connected to the 1-3rd thermoelectric module 1200-. Likewise, in a 1-2nd thermoelectric module 1200-2 and a 1-4th thermoelectric module 1200-4 disposed adjacent to each other in the direction in which the first fluid passes, the other first insulating layer 5000-2 may be integrally disposed on two connectors 400-5 and 400-6 connected to the 1-2nd thermoelectric module 1200-2 and two connectors 400-7 and 400-8 connected to the 1-4th thermoelectric module 1200-4.

At this time, the first insulating layer 5000-1 and the first insulating layer 5000-2 may be disposed to be spaced apart from each other.

As another example, referring to FIGS. 3 and 10, in the 1-1st thermoelectric module 1200-1 and the 1-3rd thermoelectric module 1200-3 disposed adjacent to each other in the direction in which the second fluid passes, one first insulating layer 5000-1 may be integrally disposed on one connector 400-1 of two connectors 400-1 and 400-2 connected to the 1-1st thermoelectric module 1200-1 and one connector 400-5 of two connectors 400-5 and 400-6 connected to the 1-2nd thermoelectric module 1200-2. Likewise, the other first insulating layer 5000-2 may be integrally disposed on the other connector 400-2 of two connectors 400-1 and 400-2 connected to the 1-1st thermoelectric module 1200-1 and the other connector 400-6 of two connectors 400-5 and 400-6 connected to the 1-2nd thermoelectric module 1200-2. At this time, the first insulating layer 5000-1 and the first insulating layer 5000-2 may be disposed to be spaced apart from each other.

As still another example, referring to FIGS. 3 and 11, in the 1-1st thermoelectric module 1200-1 and the 1-2nd thermoelectric module 1200-2 disposed adjacent to each other in the direction in which the second fluid passes, one first insulating layer 5000-1 may be integrally disposed on two connectors 400-1 and 400-2 connected to the 1-1st thermoelectric module 1200-1 and two connectors 400-5 and 400-6 connected to the 1-2nd thermoelectric module 1200-2.

As described above, when one first insulating layer 500 is disposed on the plurality of connectors 400, it is possible to simplify a process of disposing the first insulating layer 5000.

FIG. 13 is a top view showing an arrangement structure of a first insulating layer according to yet another embodiment of the present invention, and FIG. 14 is a cross-sectional view of the arrangement structure of the first insulating layer according to the embodiment of FIG. 13.

Referring to FIGS. 13 and 14, the heat insulating member 3000 and the plurality of connectors 400 may be disposed in the second region A2 of the cooling part 1100. At this time, the heights of the plurality of connectors 400 with respect to the cooling part 1100 may be greater than the height of the heat insulating member 3000. Meanwhile, the connector 400 may include a plurality of connectors disposed to be spaced apart from each other. Each of the first thermoelectric modules 1200 may be connected to at least two connectors 400. As shown in FIG. 3, when four first thermoelectric modules 1200-1, 1200-2, 1200-3, and 1200-4 are disposed on the first surface 1110 of the cooling part 1100, at least eight connectors 400 may be disposed in the second region A2 of the first surface 1110 of the cooling part 1100.

At this time, the first insulating layer 4000 may be disposed for each connector 400.

For example, referring to FIGS. 3 and 13, in the 1-1st thermoelectric module 1200-1 and the 1-2nd thermoelectric module 1200-2 disposed adjacent to each other in the direction in which the second fluid passes, first insulating layers 5000-1, . . . , 5000-4 may be disposed on two connectors 400-1 and 400-2 connected to the 1-1st thermoelectric module 1200-1 and two connectors 400-5 and 400-6 connected to the 1-2nd thermoelectric module 1200-2 for each connector.

Accordingly, it is possible to minimize an empty space between the first insulating layer 5000 and the heat insulating member 3000, and reduce the material cost of the first insulating layer 5000.

Meanwhile, in yet another embodiment of the present invention, a second insulating layer may be further disposed between the thermoelectric module and the side surface of the shield member.

FIG. 15 is a top view of a first shield member in which a second insulating layer is disposed according to the embodiment of the present invention, and FIG. 16 is a cross-sectional view of the first shield member in which the second insulating layer is disposed according to the embodiment of the present invention.

Referring to FIGS. 15 and 16, a second insulating layer 6000 may be further disposed between the first thermoelectric module 1200 and the side surface of the first shield member 2100. Accordingly, the electrical conduction due to the contact between the first thermoelectric module 1200 and the first shield member 2100 can be prevented.

As described above, the first shield member 2100 includes the first surface 2110 and the second surface 2120 having a height greater than that of the first surface 2110, and the second surface 2120 may be disposed on the connector 400. Here, the second insulating layer 6000 may be disposed along an edge of the first shield member 2100 on the side surface of the first surface 2110 of the first shield member 2100.

At this time, as shown in FIG. 16A, the second insulating layer 6000 may be disposed on the side surface of the first surface 2110. Here, the second insulating layer 6000 may have a thickness that is equal to the thickness of the first surface 2110 or greater than the thickness of the first surface 2110. Alternatively, as shown in FIG. 16B, the second insulating layer 6000 may be disposed on the side surface of the first surface 2110, and may also be disposed to extend to at least one of a lower surface of the first surface 2110 and an upper surface of the first surface 2110. At this time, the second insulating layer 6000 may contain polyimide (PI). Accordingly, the second insulating layer having excellent fire resistance, heat resistance, and insulating property can be obtained. Here, the second insulating layer 6000 may have the form of a polyimide film, a polyimide tape, a polyimide resin, or a sol-gel polyimide-silica composite. Accordingly, it is possible not only to insulate between the first thermoelectric module 1200 and the first shield member 2100, and but also to prevent external moisture, heat, contaminants, and the like from penetrating between the first thermoelectric module 1200 and the first shield member 2100.

Hereinafter, a connection relationship between the thermoelectric module, the connector, and the wire in the power generation device according to one embodiment of the present invention will be described.

FIG. 17 is a top view of a substrate and an electrode included in the thermoelectric element of the power generation device according to one embodiment of the present invention, and FIG. 18 is a perspective view of a thermoelectric module in which a heat sink is disposed on the thermoelectric element of the power generation device according to one embodiment of the present invention.

Referring to FIGS. 17 and 18, the thermoelectric module according to the embodiment of the present invention includes a thermoelectric element 100 and a heat sink 200 disposed on the thermoelectric element 100. Overlapping descriptions of the same contents as those described above with respect to the thermoelectric element 100 will be omitted.

Hereinafter, the arrangement of a connection electrode part 400E on a first substrate 110 will be mainly described.

As described above, a first insulating layer 170 is disposed on the first substrate 110, and a plurality of first electrodes 120 are disposed on the first insulating layer 170.

At this time, the plurality of first electrodes 120 may be disposed to form a plurality of electrode outer edges, and the first substrate 110 may have a plurality of substrate outer edges corresponding to the plurality of electrode outer edges. Here, the electrode outer edges may refer to edge of the plurality of first electrodes 120, and the substrate outer edges may refer to edges of the first substrate 110. For example, when the plurality of first electrodes 120 are disposed in a rectangular shape, the plurality of first electrodes 120 may have first to fourth electrode outer edges E1 to E4, and the first substrate 110 may have first to fourth substrate outer edges S1 to S4 corresponding to the first to fourth electrode outer edges E1 to E4, respectively.

In the embodiment of the present invention, the connection electrode part 400E may include a first connection electrode 410E and a second connection electrode 420E having different polarities. For example, when a (−) terminal is connected to the first connection electrode 410E, a (+) terminal may be connected to the second connection electrode 420E. For example, the first connection electrode 410E of the connection electrode part 400E may connect the thermoelectric element 100 and the (−) terminal, and the second connection electrode 420E may connect the thermoelectric element 100 and the (+) terminal. Accordingly, a position of the connection electrode part 400E may affect the insulation resistance of the thermoelectric element 100. The insulation resistance refers to an electrical resistance represented by an insulator when a predetermined voltage is applied, and the thermoelectric element 100 is required to satisfy a predetermined insulation resistance. For example, the thermoelectric element 100 is required to satisfy the requirement of having an insulation resistance of 500 MΩ or more when a DC voltage of 500 V is applied.

In the embodiment of the present invention, when the connection electrode part 400E is connected to the first electrode outer edge E1 a distance d1 between the first electrode outer edge E1 and the first substrate outer edge S1 may be longer than distances d2 to d4 between the second to fourth electrode outer edges E2 to E4 and the second to fourth substrate outer edges S2 to S4. At this time, the connection electrode part 400E may be drawn out to the outside of a sealing member (not shown) disposed to surround the first insulating layer 170, the plurality of first electrodes 120, the plurality of P-type thermoelectric elements 130, the plurality of N-type thermoelectric elements 140, the plurality of second electrodes 150, and the second insulating layer 170 between the first substrate 110 and the second substrate 160.

Here, shortest distances A1 and A2 between the connection electrode part 400E and the first substrate outer edge S1 may be 12 mm or more, preferably, 14 mm or more, and more preferably, 16 mm or more.

In addition, each of a shortest distance B1 between the second substrate outer surface S2 connected to the first substrate outer surface S1 and the first connection electrode 410E and a shortest distance B2 between the third substrate outer surface S3 connected to the first substrate outer surface S1 and the second connection electrode 420 may be 12 mm or more, preferably, 14 mm or more, and more preferably, 16 mm or more.

Alternatively, each of a shortest distance F1 from a point where the first substrate outer edge S1 and the second substrate outer edge S2 meet, that is, a vertex between the first substrate outer edge S1 and the second substrate outer edge S2 to the first connection electrode 410E and a shortest distance F2 from a point where the first substrate outer edge S1 and the third substrate outer edge S3 meet, that is, a vertex between the first substrate outer edge S1 and the third substrate outer edge S3 to the second connection electrode 420E may be 16 mm or more, preferably, 19 mm or more, and more preferably, 21 mm or more.

As described above, it is possible to obtain a thermoelectric element having an insulation resistance of 500 MΩ or more under a DC voltage of 500 V by adjusting the distance between the substrate outer edge and the connection electrode part 400E.

At this time, a connector 400 into which a wire 300 is detachably fitted may be disposed on each of the first connection electrode 410E and the second connection electrode 420E. Each of the electrode connection part 400E, the first connection electrode 410E, and the second connection electrode 420E may be disposed outside the sealing member (not shown). Accordingly, the wire connection can be simple, and the possibility of disconnection between the electrode and the wire can be minimized. At this time, two connectors may also be disposed on each connection electrode, and polarities of the wires connected to the two connectors disposed on each connection electrode may be different from or the same as each other.

To this end, as shown, each connection electrode may include a plurality of branched connection electrode regions. For example, the first connection electrode 410E may be branched into a 1-1st connection electrode region 412E and a 1-2nd connection electrode region 414E, the second connection electrode 420E may be branched into a 2-1st connection electrode region 422E and a 2-2nd connection electrode region 424E, and the connector may be disposed in each connection electrode region.

In the embodiment of the present invention, the connector may be disposed on the connection electrode part, and the wire may be detachably connected to the connector.

FIG. 19 is a perspective view of a connector disposed on a connection electrode part and a wire connected to the connector according to the embodiment of the present invention, FIG. 20 is a top view of the connector according to the embodiment of the present invention, and FIG. 21 is a rear perspective view of a state in which the wire is connected to the connector according to the embodiment of the present invention.

Referring to FIGS. 19 to 21, the connector 400 is disposed on the connection electrode 400E, and the wire 300 is connected to the connector 400. At this time, the connector 400 may be made of a conductive material, and accordingly, the thermoelectric element 100 may be electrically connected to the wire 300 through the connection electrode 400E and the connector 400.

At this time, the connector 400 may include a first wire fixing member 410 to which the wire 300 is fixed and a frame 420 configured to accommodate the first wire fixing member 410. Here, the frame 420 may have an open shape toward the connection electrode 400E. In other words, the frame 420 may include a first wall surface 4211 including a first bottom surface 4201 disposed toward the connection electrode 400E and a second wall surface 4212 including a second bottom surface 4202 disposed toward the connection electrode part 400E. At this time, the first wire fixing member 410 may be disposed to be spaced apart from the connection electrode part 400E by a predetermined distance so as not to come into contact with the connection electrode part 400E, and may move in a direction X1 or X2 toward at least one of the first wall surface 4201 of the frame 420 and the second wall surface 4202 facing the first wall surface 4201 when the wire 300 is attached or detached. Accordingly, the first wire fixing member 410 may pressurize the wire 300 in a transverse direction. Here, the transverse direction may refer to a direction that is horizontal to the direction in which the connection electrode 400E is disposed.

In addition, the frame 420 may further include a third bottom surface 4203 extending from a wire entry In and a fourth bottom surface 4204 extending from the third wall surface 4213 facing the wire entry In and spaced apart from the third bottom surface 4203. At this time, the connector 400 may further include a second wire fixing member 430 extending from the third bottom surface 4203. At this time, the second wire fixing member 430 may be spaced apart from the connection electrode 400E by a predetermined distance, and disposed to be inclined in a direction opposite to the direction toward the connection electrode 400E. Accordingly, the second wire fixing member 430 may pressurize the wire 300 in a longitudinal direction. Here, the longitudinal direction may refer to a direction perpendicular to the direction in which the connection electrode 400E is disposed.

As described above, the frame 420 may have an open shape that is spaced apart from the connection electrode part 400E by a predetermined distance except for the first bottom surface 4201 to the fourth bottom surface 4204. Accordingly, the wire 300 is easily inserted according to the movement of the first wire fixing member 410 and the second wire fixing member 430 inside the frame 420, and the inserted wire 300 may be fixed to have a high tensile strength, for example, a tensile strength of 2 kgf or more. In addition, it is possible to satisfy an allowable voltage and an allowable current for the connector 400 made of a conductive material, for example, the standards of DC 20 V and 1.5 mA.

Meanwhile, the plurality of first electrodes 120 and connection electrodes 400E configuring the thermoelectric element 100 are disposed on the same plane, that is, on the first insulating layer 170. A plurality of thermoelectric legs are mounted on the plurality of first electrodes 120, and the connector 400 is mounted on the connection electrode 400E. At this time, the plurality of first electrodes 120 and the plurality of thermoelectric legs, and the connection electrode 400E and the connector 400 may be bonded by solder. In the manufacturing process, a process of mounting the plurality of thermoelectric legs on the plurality of first electrodes 120 and a process of mounting the connector 400 on the connection electrode 400E may be performed simultaneously. Accordingly, the solder may be simultaneously printed on the plurality of first electrodes 120 and connection electrodes 400E. Hereinafter, a bonding layer is a layer in which the plurality of first electrodes 120 and the plurality of thermoelectric legs, and the connection electrodes 400E and the connector 400 are bonded, and may be, for example, a solder layer applied or printed for soldering.

Meanwhile, for bonding between the plurality of first electrodes 120 and the plurality of thermoelectric legs, it is preferable that the bonding layer after shrinkage has a thickness that satisfies a range of 0.08 to 0.1 mm. To this end, it is preferable that the bonding layer is printed on the plurality of first electrodes 120 in a range of 0.145 to 0.2 mm.

However, when the bonding layer is printed on the entire area of the connection electrode 400E in the range of 0.145 to 0.2 mm, the bonding layer may rise up to an inner region between the first bottom surface 4201 to the fourth bottom surface 4204 of the connector 400 and solidified In this case, restrictions may be applied to the movement of the first wire fixing member 410 and the second wire fixing member 420, and as a result, it is difficult to insert the wire 300 or a force of fixing the inserted wire 300 can be weakened.

In order to solve this problem, in the embodiment of the present invention, a pattern of the bonding layer on the connection electrode part is adjusted.

FIG. 22 shows an example of a pattern of a bonding layer disposed on a connection electrode according to one embodiment of the present invention.

Referring to FIG. 22, a bonding layer 700 may be disposed on a part of the connection electrode part 400E. For example, the bonding layer 700 may have a plurality of bonding layers 710, 720, 730, and 740 separated from each other on the connection electrode 400E. As described above, when the bonding layer 700 is disposed on a part that is not the entire surface of the connection electrode part 400E, the connection electrode 400E and the connector 400 may be bonded by the bonding layer 700, and it is possible to prevent a problem that the bonding layer 700 rises up to the inner region of the connector 400 even when the bonding layer 700 is printed in a thickness equal to that of the plurality of first electrodes 120.

At this time, the bonding layer 700 may include the plurality of bonding layers 710, 720, 730, and 740, and the plurality of bonding layers 710, 720, 730, and 740 may be disposed to be spaced apart from each other along a circumference of the bottom surface of the connector 400 on the connection electrode 400E.

As shown in FIGS. 17 and 18, when the connection electrode part 400E includes the first connection electrode 410E and the second connection electrode 420E, the first connection electrode 410E is branched into the 1-1st connection electrode region 412E and the 1-2nd connection electrode region 414E, and the second connection electrode 420E is branched into the 2-1st connection electrode region 422E and the 2-2nd connection electrode region 424E, the plurality of bonding layers 710, 720, 730, and 740 may be disposed in the respective connection electrode regions 412E, 414E, 422E, and 424E, and the connector 400 may be disposed in the respect connection electrode regions 412E, 414E, 422E, and 424E. Accordingly, when the connection direction of the connection electrode part 400E, that is, the direction toward the outer edge S1 of the first substrate 110 is referred to as the first direction and the direction perpendicular to the first direction, that is, the direction toward the outer edge S2 of the first substrate 110 is referred to as the second direction, a shortest distance a1 in the first direction between the plurality of bonding layers 710, 720, 730, and 740 and the outer edge S1 of the first substrate 110 may be shorter than a shortest distance b1 in the second direction between the plurality of bonding layers 710, 720, 730, and 740 and the outer edge S2 of the first substrate 110. Accordingly, it is easy to connect the wire 300 to the connector 400, and it is possible to improve the insulation resistance of the thermoelectric element 100.

Meanwhile, as described above, the plurality of bonding layers 710, 720, 730, and 740 may be disposed to be spaced apart from each other along the circumference of the bottom surface of the connector 400. Here, when the connector 400 is disposed on the connection electrode 400E, the bottom surface of the connector 400 may refer to a surface toward the connection electrode 400E, that is, a surface that comes into direct contact with the connection electrode 400E or comes into contact with the connection electrode 400E via the bonding layer 700. At this time, a part of the bottom surface of the connector 400 may include a region C having a concave shape. Here, the region C having the concave shape may be a bottom surface extending from the wire entry In of the connector 400. One bonding layer 730 among the plurality of bonding layers 710, 720, 730, and 740 may be disposed to correspond to the region C having a concave shape C1. For example, the concave shape may be disposed between an inner surface 732 and an outer surface 734 of the bonding layer 730. Here, the inner surface of the bonding layer may refer to a surface toward the inside of the connector 400, and the outer surface of the bonding layer may refer to a surface toward the outside of the connector 400. Accordingly, the connector 400 may be stably bonded and fixed to the connection electrode 400E around the wire entry In.

Meanwhile, an outer surface of at least one of the plurality of bonding layers 710, 720, 730, and 740 may be disposed at the outside of the bottom surface of the connector 400. At this time, a distance t1 between inner surfaces 712, 722, 732, and 742 of at least one of the plurality of bonding layers 710, 720, 730, and 740 and the outside of the bottom surface of the connector 400 may be greater than a distance t2 between outer surfaces 714, 724, 734, and 744 of at least one of the plurality of bonding layers 710, 720, 730, and 740 and the outside of the bottom surface of the connector 400. Accordingly, since the bottom surface of the connector 400 may be bonded to the connection electrode 400E through the plurality of bonding layers 710, 720, 730, and 740, it is possible to increase the bonding strength between the connector 400 and the connection electrode 400E.

More specifically, the plurality of bonding layers 710, 720, 730, and 740 may be disposed to correspond to a shape of the bottom surface of the frame 420 toward the connection electrode 400E. For example, the bottom surface of the frame 420 toward the connection electrode 400E may include a first bottom surface 4201 to a fourth bottom surface 4204. For example, the bonding layer 700 may include a first bonding layer 710 disposed between the first bottom surface 4201 extending from the first wall surface 4211 and the connection electrode 400E and a second bonding layer 720 disposed between the second bottom surface 4202 extending from the second wall surface 4212 and spaced apart from the first bottom surface 4201 and the connection electrode 400E. At this time, the first bonding layer 710 and the second bonding layer 720 may be spaced apart from each other. Accordingly, the first bonding layer 710 and the second bonding layer 720 are not disposed between the connection electrode 400E and the first wire fixing member 410, and the first wire fixing member 410 may move freely when the wire 300 is attached or detached.

In addition, the bonding layer 700 may further include a third bonding layer 730 disposed between the third bottom surface 4203 extending from the wire entry In of the frame 420 and the connection electrode 400E and a fourth bonding layer 740 extending from the third wall surface 4213 facing the wire entry In and spaced apart from the third bottom surface 4203 and the connection electrode 400E. At this time, the third bonding layer 730 and the fourth bonding layer 740 may be spaced apart from each other. Accordingly, the third bonding layer 730 and the fourth bonding layer 740 are not disposed between the connection electrode 400E and the second wire fixing member 430, and the second wire fixing member 430 may move freely when the wire 300 is attached or detached.

At this time, the total area of the plurality of bonding layers 710, 720, 730, and 740 may be 80 to 120% of the total area of the first bottom surface 4201, the second bottom surface 4202, the third bottom surface 4203, and the fourth bottom surface 4204. Accordingly, solder may be printed on the plurality of first electrodes 120 and the connection electrode 400E in a single process and with the same thickness, and accordingly, both the bonding layer between the plurality of first electrodes 120 and thermoelectric legs and the bonding layer between the connection electrode 400E and the connector 400 may be formed to have a thickness in a range of 0.08 to 0.1 mm. Accordingly, even when the bonding force between the connection electrode 400E and the connector 400 is high, the bonding layer 700 is not disposed in the inner region of the connector 400, so that it is easy to insert the wire 300, and the tensile strength of the inserted wire 300 can be maintained high. For example, it can be seen that when the bonding layer 700 is formed between the connecting electrode 400E and the connector 400 according to the embodiment of the present invention, a wire insertion force of 30N or less, preferably, 15N or less, and more preferably, 10N or less is required when the wire 300 is inserted into the connector 400, and a tensile strength of 30N or more, preferably, 40N or more, and more preferably, 50N or more is required when the inserted wire 300 is separated from the connector 400.

The thermoelectric element according to the embodiment of the present invention may be applied to power generation devices, cooling devices, heating devices, and the like.

Although the above has been described with reference to the preferred embodiments of the present invention, those skilled in the art may understand that the present invention may be variously modified and changed without departing from the spirit and scope of the present invention described in the appended claims.

The invention claimed is:

1. A power generation device, comprising:
    a cooling part;
    a thermoelectric module disposed in a first region on one surface of the cooling part;
    a connector part disposed in a second region on the one surface of the cooling part, and connected to the thermoelectric module;
    a heat insulating member disposed to expose at least a part of the connector part on the one surface of the cooling part;
    a shield member disposed to cover the heat insulating member and the connector part; and
    a first insulating layer disposed between the connector part and the shield member,
    wherein the heat insulating member is disposed on a side surface of the connector part,
    wherein a thickness of the connector part is greater than a thickness of the heat insulating member,
    wherein a first fluid is configured to flow through the cooling part,
    wherein a second fluid is configured to flow along an upper surface of the shield member, and
    wherein a temperature of the second fluid is higher than a temperature of the first fluid.

2. The power generation device of claim 1, wherein the connector part includes a plurality of connectors disposed to be spaced apart from each other, and
    the first insulating layer is a plurality of first insulating layers disposed for each connector.

3. The power generation device of claim 1, wherein the connector part includes a plurality of connectors disposed to be spaced apart from each other, and
    the first insulating layer is integrally disposed on the plurality of connectors.

4. The power generation device of claim 1, wherein the first insulating layer includes polyimide (PI).

5. The power generation device of claim 1, further comprising a second insulating layer disposed between the thermoelectric module and a side surface of the shield member.

6. The power generation device of claim 5, wherein the shield member includes a first area, and a second area having a height greater than that of the first area,
the second area is disposed on the connector part, and
the second insulating layer is disposed on the side surface of the first area.

7. The power generation device of claim 6, wherein the second insulating layer extends from the side surface of the first area to at least one of a bottom surface of the first area and an upper surface of the first area.

8. The power generation device of claim 1, further comprising a wire part connected to the connector part, wherein the wire part is disposed between the one surface of the cooling part and the heat insulating member in the second region.

9. The power generation device of claim 1, wherein the thermoelectric module includes:
a thermoelectric element including a first substrate, a first electrode disposed on the first substrate, a semiconductor structure disposed on the first electrode, a second electrode disposed on the semiconductor structure, and a second substrate disposed on the second electrode; and
a connection electrode part disposed on the first substrate,
the connector part is disposed on the connection electrode part, and
the connection electrode part is disposed to be spaced apart from an outer edge of the first substrate.

* * * * *